United States Patent
Das et al.

(10) Patent No.: US 11,442,667 B2
(45) Date of Patent: Sep. 13, 2022

(54) SYSTEMS AND METHODS FOR MANAGING THERMAL DISSIPATION IN MULTI-STACKED DIES

(71) Applicant: SMART IOPS, INC., Milpitas, CA (US)

(72) Inventors: Ashutosh K. Das, Cupertino, CA (US); Manuel A. d'Abreu, El Dorado Hills, CA (US)

(73) Assignee: SMART IOPS, INC., Milpitas, CA (US)

( * ) Notice: Subject to any disclaimer, the term of this patent is extended or adjusted under 35 U.S.C. 154(b) by 8 days.

(21) Appl. No.: 17/184,419

(22) Filed: Feb. 24, 2021

(65) Prior Publication Data

US 2021/0263684 A1 Aug. 26, 2021

Related U.S. Application Data

(60) Provisional application No. 62/980,744, filed on Feb. 24, 2020.

(51) Int. Cl.
*G06F 3/06* (2006.01)
*G06F 1/20* (2006.01)
*G06F 13/16* (2006.01)
*H01L 25/065* (2006.01)

(52) U.S. Cl.
CPC ............ *G06F 3/0659* (2013.01); *G06F 1/206* (2013.01); *G06F 3/0604* (2013.01); *G06F 3/064* (2013.01); *G06F 3/0679* (2013.01); *G06F 13/1668* (2013.01); *H01L 25/0657* (2013.01); *H01L 2225/06589* (2013.01)

(58) Field of Classification Search
None
See application file for complete search history.

(56) References Cited

U.S. PATENT DOCUMENTS

| | | | | |
|---|---|---|---|---|
| 5,765,204 A | * | 6/1998 | Bakke | G06F 3/0674 711/112 |
| 6,021,076 A | * | 2/2000 | Woo | G11C 11/40626 365/211 |
| 6,453,218 B1 | * | 9/2002 | Vergis | G05D 23/1917 700/12 |
| 6,507,530 B1 | * | 1/2003 | Williams | G11C 11/4078 365/226 |

(Continued)

*Primary Examiner* — Elias Mamo
(74) *Attorney, Agent, or Firm* — Willink & Hunt LLP; Marcus T. Hunt

(57) ABSTRACT

Systems for managing thermal dissipation in multi-stacked memory dies, and methods and computer-readable storage media related thereto, are provided. The system includes memory dies including memory blocks to store data. A processing component is configured to maintain memory block states for the memory blocks. The memory block states include: an open memory block state allowing write operations, and a closed memory block state preventing write operations. The processing component is further configured to: receive a first write command to store first data, and compute first relative distances between open memory blocks in the open memory block state. The processing component is further configured to: select a set of open memory blocks for a first write operation based on the first relative distances so as to manage thermal dissipation, and initiate the first write operation on the first set of open memory blocks.

20 Claims, 9 Drawing Sheets

(56) References Cited

U.S. PATENT DOCUMENTS

| | | | | |
|---|---|---|---|---|
| 9,959,936 B1* | 5/2018 | Song | ............ | G06F 12/0246 |
| 2013/0275665 A1* | 10/2013 | Saraswat | ............ | G11C 7/04 |
| | | | | 711/105 |
| 2021/0166746 A1* | 6/2021 | Lu | ............ | G11C 11/5628 |

* cited by examiner

| Die No. | State | Memory Block No. | State |
|---|---|---|---|
| 200f | Active | 1 | closed |
| | | 2 | closed |
| | | 3 | closed |
| | | 4 | closed |
| | | 5 | open |
| | | 6 | closed |
| | | 7 | closed |
| | | 8 | open |
| | | 9 | closed |
| | | 10 | open |
| | | 11 | open |
| | | 12 | open |
| | | 13 | closed |
| | | 14 | open |
| | | 15 | closed |
| | | 16 | closed |
| | | 17 | closed |
| | | 18 | open |
| | | 19 | closed |
| | | 20 | closed |

| Die No. | State | Memory Block No. | State |
|---|---|---|---|
| 200e | Active | 1 | closed |
| | | 2 | open |
| | | 3 | closed |
| | | 4 | closed |
| | | 5 | open |
| | | 6 | open |
| | | 7 | open |
| | | 8 | closed |
| | | 9 | closed |
| | | 10 | closed |
| | | 11 | closed |
| | | 12 | closed |
| | | 13 | closed |
| | | 14 | open |
| | | 15 | closed |
| | | 16 | closed |
| | | 17 | open |
| | | 18 | open |
| | | 19 | closed |
| | | 20 | closed |

SYSTEMS AND METHODS FOR MANAGING THERMAL DISSIPATION IN MULTI-STACKED DIES

CROSS-REFERENCE TO RELATED APPLICATIONS

This application claims the benefit of U.S. Provisional Application No. 62/980,744, filed Feb. 24, 2020, the entirety of which is incorporated by reference.

FIELD

The present disclosure relates generally to the field of thermal management of memory, and more particularly to managing thermal dissipation in stacked memory dies during write operations.

BACKGROUND

With advances in non-volatile memory (NVM) technologies, device types, and packaging schemes, storage systems need to be architectured so as to manage the thermal profile of all the memory dies that are used in the storage systems. Thermal management directly impacts the reliability of the storage device and the data stored in it.

A controller for a solid-state storage device (SSD) typically manages one type of memory technology—for example a planar NAND flash, a 3D NAND, a ReRAM, or a MRAM device technology. Each of these technologies has its strengths and weaknesses. Different memory technologies used in storage systems have different thermal profiles. Furthermore, with stacked memory dies, thermal issues can be significant. Thus, thermal management can play a vital role in ensuring acceptable performance in stacked memory dies. What is needed is a system that can provide thermal management within multi-stacked memory dies.

SUMMARY

In one aspect of the present disclosure, a system for managing thermal dissipation in multi-stacked memory dies is provided. The system includes a first plurality of memory dies in a stacked configuration. The first plurality of memory dies includes a first plurality of memory blocks to store data. The system also includes a processing component coupled to the first plurality of memory dies. The processing component is configured to maintain memory block states for the first plurality of memory blocks. The memory block states include: an open memory block state allowing write operations; and a closed memory block state preventing write operations. The processing component is further configured to: receive a first write command to store first data; compute first relative distances between a first plurality of open memory blocks. The first plurality of open memory blocks are in the open memory block state. The first plurality of memory dies includes the first plurality of open memory blocks. The processing component is further configured to select a first set of open memory blocks for a first write operation. The first write operation is for storing the first data. The first set of open memory blocks is selected from the first plurality of open memory blocks. The first set of open memory blocks is selected based on the first relative distances so as to manage thermal dissipation. The processing component is further configured to initiate the first write operation on the first set of open memory blocks.

In an embodiment, the processing component is further configured to update the maintained memory block states, in response to the first write operation, to indicate a change of the first set of open memory blocks from the open memory block state to the closed memory block state. In an embodiment, the processing component is further configured to maintain memory die states for the first plurality of memory dies. The memory die states include: an active memory die state allowing write operations; and an inactive memory die state preventing write operations. The processing component is further configured to select one or more active memory dies for the computing of the first relative distances between the first plurality of open memory blocks. The selected one or more active memory dies: are in the active memory die state; are selected from the first plurality of memory dies; and include the first plurality of open memory blocks. The first set of open memory blocks are collectively disposed across each of a first set of active memory dies. The selected one or more active memory dies include the first set of active memory dies. In an embodiment, the selected one or more active memory dies is equal to the first set of active memory dies. In an embodiment, the selected one or more active memory dies is greater than the first set of active memory dies. In an embodiment, the first set of active memory dies consists of a single active memory die. In an embodiment, the first set of active memory dies includes more than one active memory die. In an embodiment, the processing component is further configured to update the maintained memory die states to indicate a change to the inactive memory die state for any of the first set of active memory dies that reaches a predetermined minimum threshold number of open memory blocks remaining. In an embodiment, the first plurality of memory dies includes at least two different memory technologies. In an embodiment, the processing component is further configured to select the first set of active memory dies based on reducing adjacent memory dies so as to manage thermal dissipation. In an embodiment, the selecting of the one or more active memory dies is based on reducing adjacent memory dies so as to manage thermal dissipation. In an embodiment, the selecting of the first set of open memory blocks is further based on reducing adjacent memory dies so as to manage thermal dissipation. In an embodiment, the memory block states and the memory die states are maintained in one or more state tables for the first plurality of memory dies and the second plurality of memory dies, and wherein the one or more state tables is stored in memory coupled to the processing component.

In an embodiment, the processing component is further configured to receive a read command to read the first data stored in the first set of open memory blocks; and initiate a read operation on the first set of open memory blocks.

In an embodiment, the processing component is further configured to: receive a second write command to store second data; and compute second relative distances between a second plurality of open memory blocks. The second plurality of open memory blocks are in the open memory block state. The first plurality of memory dies includes the second plurality of open memory blocks. The processing component is further configured to select a second set of open memory blocks for a second write operation. The second write operation is for storing the second data. The second set of open memory blocks is selected from the second plurality of open memory blocks. The second set of open memory blocks is selected based on the second relative distances so as to manage thermal dissipation. The processing component is further configured to initiate the second write operation on the second set of open memory blocks.

In an embodiment, the system further includes a second plurality of memory dies in a stacked configuration. The second plurality of memory dies includes a second plurality of memory blocks to store data. The processing component is coupled to the second plurality of memory dies and is further configured to: maintain the memory block states for the second plurality of memory blocks; and select the first plurality of memory dies for the first write operation. In an embodiment, the system further includes: a first memory device including the first plurality of memory dies; a second memory device including the second plurality of memory dies; and a host interface configured to couple the processing component to a host. The processing component is a controller coupled to the first and second memory devices. In an embodiment, the processing component is further configured to compute second relative distances between a second plurality of open memory blocks. The second plurality of open memory blocks are in the open memory block state. The second plurality of memory dies includes the second plurality of open memory blocks. The processing component is further configured to select a second set of open memory blocks for a second write operation for storing the first data. The second set of open memory blocks is selected from the second plurality of open memory blocks. The second set of open memory blocks is selected based on the second relative distances so as to manage thermal dissipation. The processing component is further configured to initiate a second write operation on the second set of open memory blocks. The first write operation stores a first portion of the first data, and wherein the second write operation stores a second portion of the first data. In an embodiment, the processing component is further configured to maintain memory die states for the first plurality of memory dies and the second plurality of memory dies. The memory die states include: an active memory die state allowing write operations; and an inactive memory die state preventing write operations. The processing component is further configured to select a first one or more active memory dies for the computing of the first relative distances between the first plurality of open memory blocks. The selected first one or more active memory dies: are in the active memory dies state; are selected from the first plurality of memory dies; and include the first plurality of open memory blocks. The first set of open memory blocks are collectively disposed across each of a first set of active memory dies. The selected first one or more active memory dies include the first set of active memory dies. The processing component is further configured to select a second one or more active memory dies for the computing of the second relative distances between the second plurality of open memory blocks. The selected second one or more active memory dies: are in the active memory dies state; are selected from the second plurality of memory dies; and include the second plurality of open memory blocks. The second set of open memory blocks are collectively disposed across each of a second set of active memory dies. The selected second one or more active memory dies include the second set of active memory dies.

In an aspect of the present disclosure, a method for managing thermal dissipation in multi-stacked memory dies is provided. The method includes maintaining, by a processing component, memory block states for a first plurality of memory blocks. The processing component is coupled to a first plurality of memory dies in a stacked configuration. The first plurality of memory dies includes the first plurality of memory blocks to store data. The memory block states include: an open memory block state allowing write operations; and a closed memory block state preventing write operations. The method further includes: receiving, by the processing component, a first write command to store first data; and computing, by the processing component, first relative distances between a first plurality of open memory blocks. The first plurality of open memory blocks are in the open memory block state, and the first plurality of memory dies includes the first plurality of open memory blocks. The method further includes selecting, by the processing component, a first set of open memory blocks for a first write operation. The first write operation is for storing the first data, the first set of open memory blocks is selected from the first plurality of open memory blocks, and the first set of open memory blocks is selected based on the first relative distances so as to manage thermal dissipation. The method further includes initiating, by the processing component, the first write operation on the first set of open memory blocks.

In an embodiment, the method further includes updating, by the processing component, the maintained memory block states, in response to the first write operation, to indicate a change of the first set of open memory blocks from the open memory block state to the closed memory block state. In an embodiment, the method further includes maintaining, by the processing component, memory die states for the first plurality of memory dies. The memory die states include: an active memory die state allowing write operations; and an inactive memory die state preventing write operations. The method further includes selecting, by the processing component, one or more active memory dies for the computing of the first relative distances between the first plurality of open memory blocks. The selected one or more active memory dies: are in the active memory die state; are selected from the first plurality of memory dies; and include the first plurality of open memory blocks. The first set of open memory blocks are collectively disposed across each of the first set of active memory dies; and the selected one or more active memory dies include the first set of active memory dies. In an embodiment, the selected one or more active memory dies is equal to the first set of active memory dies. In an embodiment, the selected one or more active memory dies is greater than the first set of active memory dies. In an embodiment, the first set of active memory dies consists of a single active memory die. In an embodiment, the first set of active memory dies includes more than one active memory die. In an embodiment, the method further includes updating, by the processing component, the maintained memory die states to indicate a change to the inactive memory die state for any of the first set of active memory dies that reaches a predetermined minimum threshold number of open memory blocks remaining. In an embodiment, the first plurality of memory dies includes at least two different memory technologies. In an embodiment, the method further includes selecting, by the processing component, the first set of active memory dies based on reducing adjacent memory dies so as to manage thermal dissipation. In an embodiment, the selecting of the one or more active memory dies is based on reducing adjacent memory dies so as to manage thermal dissipation. In an embodiment, the selecting of the first set of open memory blocks is further based on reducing adjacent memory dies so as to manage thermal dissipation. In an embodiment, the memory block states and the memory die states are maintained in one or more state tables for the first plurality of memory dies and the second plurality of memory dies, and the one or more state tables is stored in memory coupled to the processing component.

In an embodiment, the method further includes: receiving, by the processing component, a read command to read the first data stored in the first set of open memory blocks; and initiating, by the processing component, a read operation on the first set of open memory blocks.

In an embodiment, the method further includes: receiving, by the processing component, a second write command to store second data; and computing, by the processing component, second relative distances between a second plurality of open memory blocks. The second plurality of open memory blocks are in the open memory block state, and the first plurality of memory dies includes the second plurality of open memory blocks. The method further includes selecting, by the processing component, a second set of open memory blocks for a second write operation. The second write operation is for storing the second data, the second set of open memory blocks is selected from the second plurality of open memory blocks, and the second set of open memory blocks is selected based on the second relative distances so as to manage thermal dissipation. The method further includes initiating, by the processing component, the second write operation on the second set of open memory blocks.

In an embodiment, the method further includes maintaining, by the processing component, the memory block states for a second plurality of memory blocks. The processing component is coupled to a second plurality of memory dies in a stacked configuration, and the second plurality of memory dies includes the second plurality of memory blocks to store data. The method further includes selecting the first plurality of memory dies for the first write operation. In an embodiment, a first memory device includes the first plurality of memory dies; a second memory device includes the second plurality of memory dies; the processing component is a controller coupled to the first and second memory devices; and a host interface is configured to couple the processing component to a host. In an embodiment, the method further includes computing, by the processing component, second relative distances between a second plurality of open memory blocks. The second plurality of open memory blocks are in the open memory block state, and the second plurality of memory dies includes the second plurality of open memory blocks. The method further includes selecting, by the processing component, a second set of open memory blocks for a second write operation for storing the first data. The second set of open memory blocks is selected from the second plurality of open memory blocks, and the second set of open memory blocks is selected based on the second relative distances so as to manage thermal dissipation. The method further includes initiating, by the processing component, the second write operation on the second set of open memory blocks. The first write operation stores a first portion of the first data, and the second write operation stores a second portion of the first data. In an embodiment, the method further includes maintaining, by the processing component, memory die states for the first plurality of memory dies and the second plurality of memory dies. The memory die states include: an active memory die state allowing write operations; and an inactive memory die state preventing write operations. The method further includes selecting, by the processing component, a first one or more active memory dies for the computing of the first relative distances between the first plurality of open memory blocks. The selected first one or more active memory dies: are in the active memory die state; are selected from the first plurality of memory dies; and include the first plurality of open memory blocks. The first set of open memory blocks are collectively disposed across each of a first set of active memory dies; and the selected first one or more active memory dies include the first set of active memory dies. The method further includes selecting, by the processing component, a second one or more active memory dies for the computing of the second relative distances between the second plurality of open memory blocks. The selected second one or more active memory dies: are in the active memory die state; are selected from the second plurality of memory dies; and include the second plurality of open memory blocks. The second set of open memory blocks are collectively disposed across each of a second set of active memory dies; and the selected second one or more active memory dies include the second set of active memory dies.

In an aspect of the present disclosure, one or more non-transitory computer-readable storage media including instructions, which when executed by a processing component, cause the processing component to: maintain memory block states for a first plurality of memory blocks. The processing component is coupled to a first plurality of memory dies in a stacked configuration, the first plurality of memory dies includes the first plurality of memory blocks to store data, and the memory block states include: an open memory block state allowing write operations; and a closed memory block state preventing write operations. The instructions further cause the processing component to: receive a first write command to store first data; and compute first relative distances between a first plurality of open memory blocks. The first plurality of open memory blocks are in the open memory block state, and the first plurality of memory dies includes the first plurality of open memory blocks. The instructions further cause the processing component to select a first set of open memory blocks for a first write operation. The first write operation is for storing the first data, the first set of open memory blocks is selected from the first plurality of open memory blocks, and the first set of open memory blocks is selected based on the first relative distances so as to manage thermal dissipation. The instructions further cause the processing component to initiate the first write operation on the first set of open memory blocks.

In an embodiment, the instructions further cause the processing component to update the maintained memory block states, in response to the first write operation, to indicate a change of the first set of open memory blocks from the open memory block state to the closed memory block state. In an embodiment, the instructions further cause the processing component to maintain memory die states for the first plurality of memory dies. The memory die states include: an active memory die state allowing write operations; and an inactive memory die state preventing write operations. The instructions further cause the processing component to select one or more active memory dies for the computing of the first relative distances between the first plurality of open memory blocks. The selected one or more active memory dies: are in the active memory die state; are selected from the first plurality of memory dies; and include the first plurality of open memory blocks. The first set of open memory blocks are collectively disposed across each of a first set of active memory dies; and the selected one or more active memory dies include the first set of active memory dies. In an embodiment, the selected one or more active memory dies is equal to the first set of active memory dies. In an embodiment, the selected one or more active memory dies is greater than the first set of active memory dies. In an embodiment, the first set of active memory dies consists of a single active memory die. In an embodiment, the first set of active memory dies includes more than one active memory die. In an embodiment, the instructions further cause the processing component to update the maintained memory die states to indicate a change to the inactive memory die state for any of the first set of active memory dies that reaches a predetermined minimum threshold number of open memory blocks remaining. In an embodiment, the first plurality of memory dies includes at least two different memory technologies. In an embodiment, the instructions further cause the processing component to select the first set of active memory dies based on reducing adjacent memory dies to manage thermal dissipation. In an embodiment, the selecting of the one of the one or more active memory dies is based on reducing adjacent memory dies so as to manage thermal dissipation. In an embodiment, the selecting of the first set of open memory blocks is based on reducing adjacent memory dies so as to manage thermal dissipation. In an embodiment, the memory block states and the memory die states are maintained in one or more state tables for the first plurality of memory dies and the second plurality of memory dies. The one or more state tables is stored in memory coupled to the processing component.

In an embodiment, the instructions further cause the processing component to receive a read command to read the first data stored in the first set of open memory blocks; and initiate a read operation on the first set of open memory blocks.

In an embodiment, the instructions further cause the processing component to receive a second write command to store second data; and compute second relative distances between a second plurality of open memory blocks. The second plurality of open memory blocks are in the open memory block state, and the first plurality of memory dies includes the second plurality of open memory blocks. The instructions further cause the processing component to select a second set of open memory blocks for a second write operation, wherein the second write operation is for storing the second data. The second set of open memory blocks is selected from the second plurality of open memory blocks, and the second set of open memory blocks is selected based on the second relative distances so as to manage thermal dissipation. The instructions further cause the processing component to initiate the second write operation on the second set of open memory blocks.

In an embodiment, the instructions further cause the processing component to maintain the memory block states for a second plurality of memory blocks. The processing component is coupled to a second plurality of memory dies in a stacked configuration, and the second plurality of memory dies includes the second plurality of memory blocks to store data. The instructions further cause the processing component to select the first plurality of memory dies for the first write operation. In an embodiment, a first memory device includes the first plurality of memory dies; a second memory device includes the second plurality of memory dies; the processing component is a controller coupled to the first and second memory devices; and a host interface is configured to couple the processing component to a host. In an embodiment, the instructions further cause the processing component to compute second relative distances between a second plurality of open memory blocks. The second plurality of open memory blocks are in the open memory block state, and the second plurality of memory dies includes the second plurality of open memory blocks. The instructions further cause the processing component to select a second set of open memory blocks for a second write operation for storing the first data. The second set of open memory blocks is selected from the second plurality of open memory blocks, and the second set of open memory blocks is selected based on the second relative distances so as to manage thermal dissipation. The instructions further cause the processing component to initiate a second write operation on the second set of open memory blocks. The first write operation stores a first portion of the first data, and the second write operation stores a second portion of the first data. In an embodiment, the instructions further cause the processing component to maintain memory die states for the first plurality of memory dies and the second plurality of memory dies. The memory die states include: an active memory die state allowing write operations; and an inactive memory die state preventing write operations. The instructions further cause the processing component to select a first one or more active memory dies for the computing of the first relative distances between the first plurality of open blocks. The selected first one or more active memory dies: are in the active memory die state; are selected from the first plurality of memory dies; and include the first plurality of open memory blocks. The first set of open memory blocks are collectively disposed across each of a first set of active memory dies; and the selected first one or more active memory dies include the first set of active memory dies. The instructions further cause the processing component to select a second one or more active memory dies for the computing of the second relative distances between the second plurality of open memory blocks. The selected second one or more active memory dies: are in the active memory die state; are selected from the second plurality of memory dies; and include the second plurality of open memory blocks. The second set of open memory blocks are collectively disposed across each of a second set of active memory dies; and the selected second one or more active memory dies include the second set of active memory dies.

BRIEF DESCRIPTION OF THE DRAWINGS

For a better understanding of at least an embodiment, reference will be made to the following Detailed Description, which is to be read in conjunction with the accompanying drawings, wherein.

DETAILED DESCRIPTION

Figure 1:
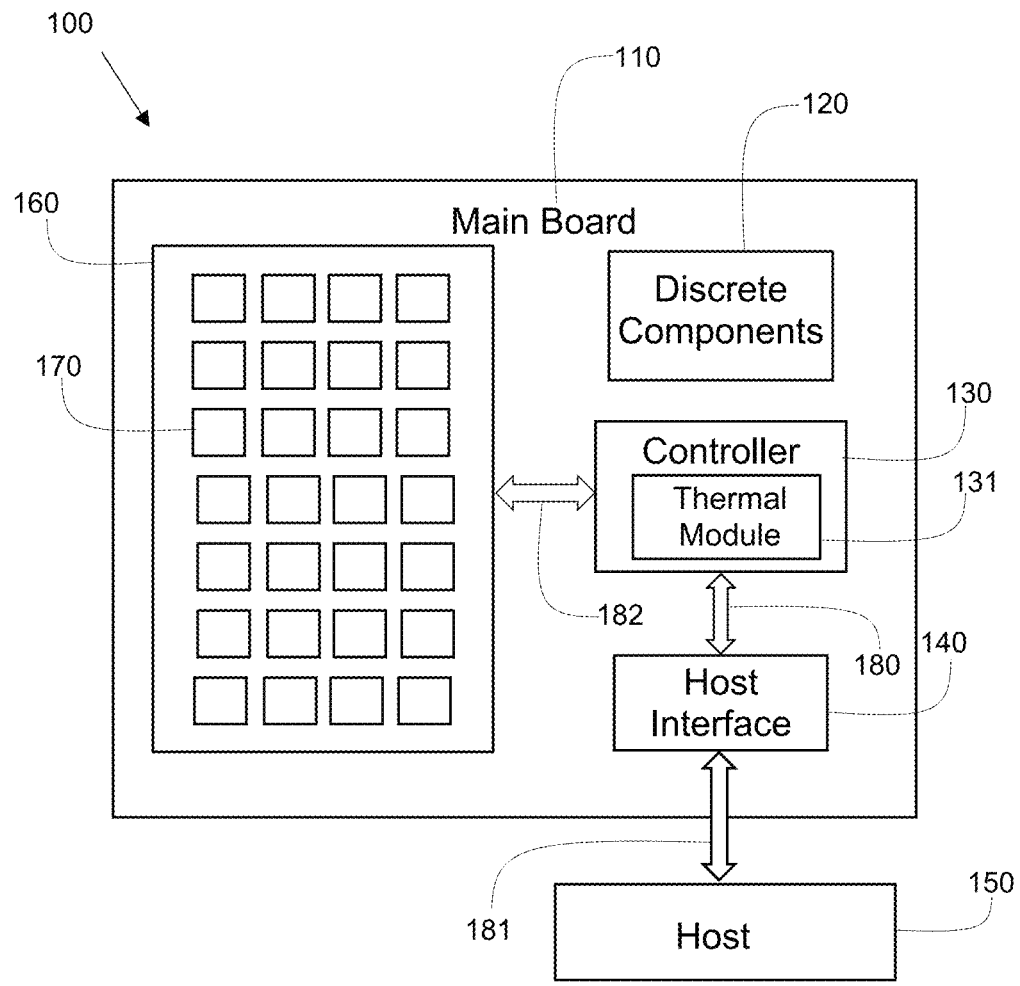
FIG. 1 illustrates a block diagram for an exemplary system that manages thermal dissipation in multi-stacked dies in a memory device, according to an embodiment

Before aspects of the present disclosure are described below with reference to the drawings. In the description, common features may be designated by common reference numbers. Although certain examples are described herein with reference to a storage system (or data storage system or device), it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more conditions, or events not explicitly recited. As used herein, "exemplary" may indicate an example, an implementation, and/or an aspect, and should not be construed as limiting or as indicating a preference or a preferred example, implementation, and/or aspect.

In certain aspects, the present disclosure describes systems and methods of programming data to, or reading data from, a memory card, a storage system, or a set of memory cards, according to the use of an architecture using controller scheme for the memory card, or the storage system. For example, a controller of a storage system (e.g., data storage device) may receive a data packet to be stored in a number of memory devices. The controller may partition the data word into multiple portions and interleave the multiple portions across multiple memory devices. Also, the controller may simultaneously start parallel reads from several memory devices. Additionally, prior to the multiple data packets being stored into, or read from, the memory card, or storage system, a logical address corresponding to the data packets may be mapped to multiple physical addresses that indicate where each of the multiple data packets is to be stored in, or read from, the memory card or storage system. The writing of data and reading of data can be performed simultaneously across several memory cards in the storage system.

Due to operating temperature of the memory device, incomplete erasure of the memory, programming errors, or other conditions, errors can occur in the stored data. The number of errors in a specific wordline, blocks or combination thereof, can increase. The error profile is very specific to memory technology. One aspect of this disclosure is the use of adaptive thermal management techniques to reduce malfunctions due to high temperature, by achieving a uniform temperature gradient on the memory die by reducing hot spots. Thus, the integrity of the data remains uncompromised and also the endurance of the system and capability to store data for extended time (data retention) can be adapted to the specific usage profile for the storage system, and technology. The subject matter of the present disclosure may be applicable to a wide range of areas, including, but not limited to, storage, networking, communication and computing systems, appliances on the Internet, remotely controlled appliances, and design of reliable systems.

FIG. 1 illustrates a block diagram for an exemplary system that manages thermal dissipation in multi-stacked dies in a memory device, according to an embodiment. A storage system 100 is shown in FIG. 1 and includes a main board 110. The main board 110 has discrete components 120, a processing component 130 (e.g., controller 130), the host interface 140, and a memory card 160. The processing component 130 is implemented as a controller (i.e., the controller 130) in the embodiment shown in FIG. 1. While the description herein may make references to the controller 130, it should be appreciated that the references can be equally applied to another implementation of the processing component 130. The processing component 130 can include various hardware elements, software elements, or a combination of both. Examples of hardware elements may include one or more of the following: devices, logic devices, components, processors (or microprocessors, embedded processors, multi-core processors, etc.), controllers (or microcontrollers, embedded controllers, etc.), hard-wired circuits, processor circuits, circuit elements (e.g., transistors, resistors, capacitors, inductors, and so forth), integrated circuits, special-purpose hardware (e.g., application specific integrated circuits (ASIC), programmable logic devices (PLD), digital signal processors (DSP), field programmable gate array (FPGA)), memory units, hard-wired logic, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with the application.

The memory card 160 has an array of memory devices, of which a memory device 170 is a representative device. The memory card 160 can include a large number of memory devices 170. The memory card 160 can be Flash based, ReRAM or any other non-volatile memory (NVM) technology. The main board 110 has a bus 180 that connects the controller 130 to the host interface 140, and bus 182 which the controller 130 uses to manage the memory devices 170 in the memory card 160. A thermal module 131 in the controller 130 manages the thermal dissipation inside the memory devices 170. The storage system 100 of FIG. 1 communicates with a host (or accessing device) 150 through the interface 181. The interface 181 may be, for example, PCIe, SATA, USB, USC or any other standard or proprietary interface. The controller 130 manages the communication to the host 150, the access to the NVM, and the memory management software. The discrete components 120 can include passive components such as capacitors, resistors, inductors, and active components such as diodes, transistors. This list of example discrete components is an illustrative list and not an exhaustive list.

The storage system 100 may include or correspond to a data storage device, controller, or other apparatus. In an embodiment, the storage system 100 in FIG. 1 may include or correspond to a solid-state drive (SSD), which may be included in, or distinct from (and accessible to), the host 150. For example, the storage system 100 in FIG. 1 may include or correspond to an SSD, which may be used as an embedded storage drive (e.g., a mobile embedded storage drive), an enterprise storage drive (ESD), a client storage device, or a cloud storage drive, as illustrative, non-limiting examples. In an embodiment, the data storage device 100 in FIG. 1 may be coupled to the host 150 indirectly, e.g., via a network. For example, the network may include a data center storage system network, an enterprise storage system network, a storage area network, a cloud storage network, a local area network (LAN), a wide area network (WAN), the Internet, and/or another network. In an embodiment, the data storage device 100 of FIG. 1 may be a network-attached storage (NAS) device or a component (e.g., an SSD device) of a data center storage system, an enterprise storage system, or a storage area network.

The host 150 may include a processor and a memory (neither shown in FIG. 1). The memory may be configured to store data and/or instructions that may be executable by the processor (or microprocessor). The memory may be a single memory or may include multiple memories, such as one or more non-volatile memories, one or more volatile memories, or a combination thereof. The host 150 may issue one or more commands to the storage system 100 of FIG. 1, such as one or more requests to erase data, read data from, or write data to the memory card module 160 of the storage system 100 of FIG. 1. The host 150 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

Figure 2:
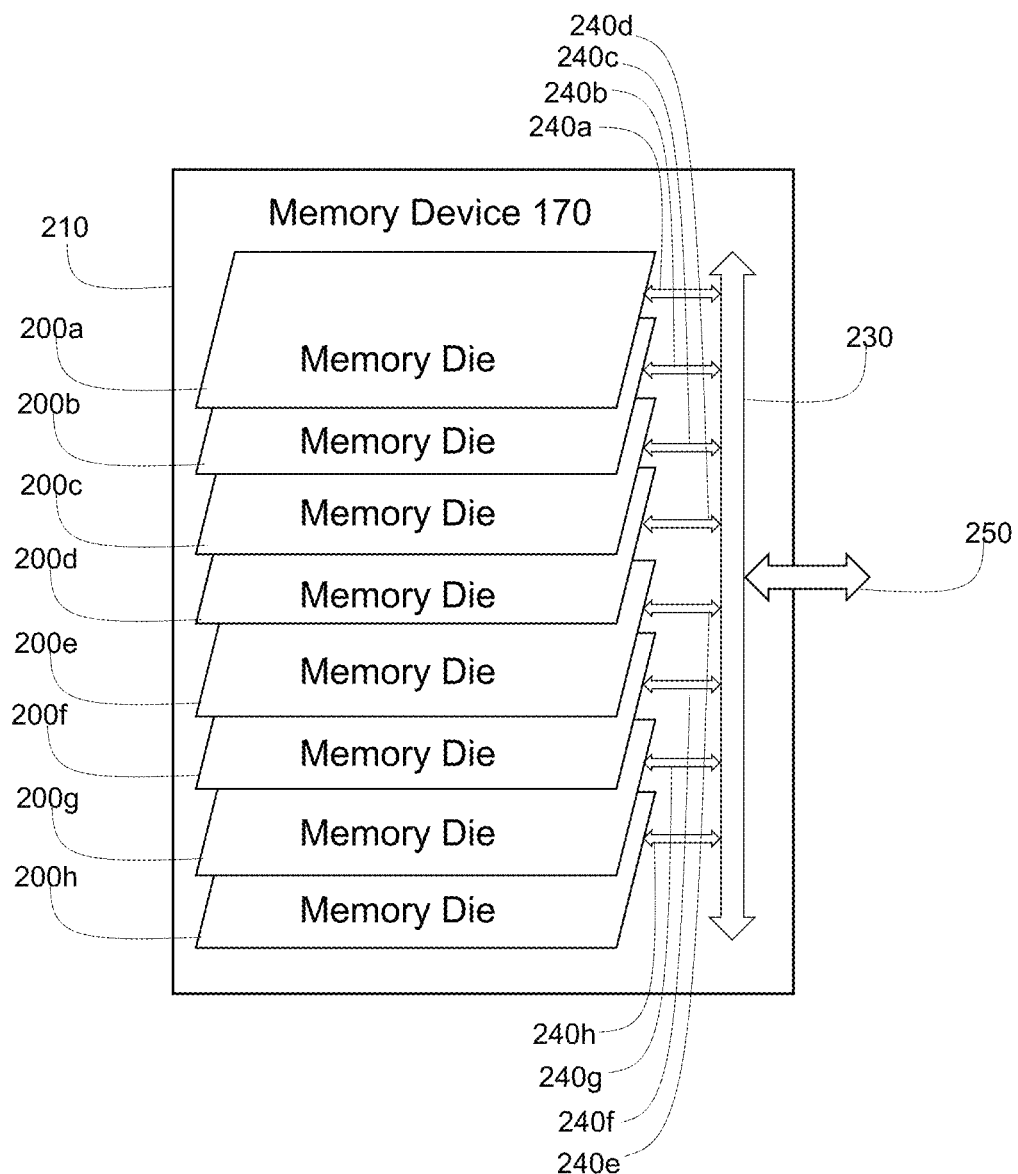
FIG. 2 illustrates a block diagram for an exemplary non-volatile memory device 170, according to an embodiment

FIG. 2 illustrates a block diagram for an exemplary non-volatile memory device 170, according to an embodiment. The interface 250 provides the communication interface for input/output signals, voltages signals, and control signals in and out of the memory device 170. This is an illustrative example and the interface for the memory device is not limited to this embodiment. The memory device 170 in FIG. 2 can include, for example, a memory package having an enclosure 210 which houses a stack of memory dies 200a, 200b, 200c, 200d, 200e, 200f, 200g, and 200h. The term "memory die 200" is used herein to refer generally to one of the memory dies 200a, 200b, 200c, 200d, 200e, 200f, 200g, and 200h. The term "memory dies 200" is used herein to refer collectively to all of the memory dies 200a, 200b, 200c, 200d, 200e, 200f, 200g, and 200h. The bus 230 is an internal bus that provides connectivity between the package interface 250 and the memory dies 200 in the stack. The memory dies 200 in the stack are connected to the bus 230 by dedicated buses 240a, 240b, 240c, 240d, 240e, 240f, 240g, and 240h. The term "bus 240" is used herein to refer generally to one of the buses 240a, 240b, 240c, 240d, 240e, 240f, 240g, and 240h. The term "buses 240" is used herein to refer collectively to all of the buses 240a, 240b, 240c, 240d, 240e, 240f, 240g, and 240h.

The memory device 170 shown is exemplary and is not an exhaustive illustration. In an embodiment, the memory device can support different memory technologies. For example, the memory device 170 can be 2D Flash, ReRAM, 3D Flash, other NVM technologies, or any combination of these technologies. In some cases, a usage model for an SSD might have to meet thermal requirements needs that cannot be met by just one type of technology. In such case, it may be necessary to have a storage system that incorporates a mix of these technologies—a hybrid system. Therefore, the thermal management inside the stacked memory die may be needed to ensure acceptable performance. In certain aspects, the present disclosure provides for storage systems, and methods related thereto, that include memory dies built with different technologies. It should be appreciated that the memory device (and related techniques described herein) can be implemented as a memory chip housing multiple stacked dies, or as embedded memory dies in a stacked configuration.

Figure 3:
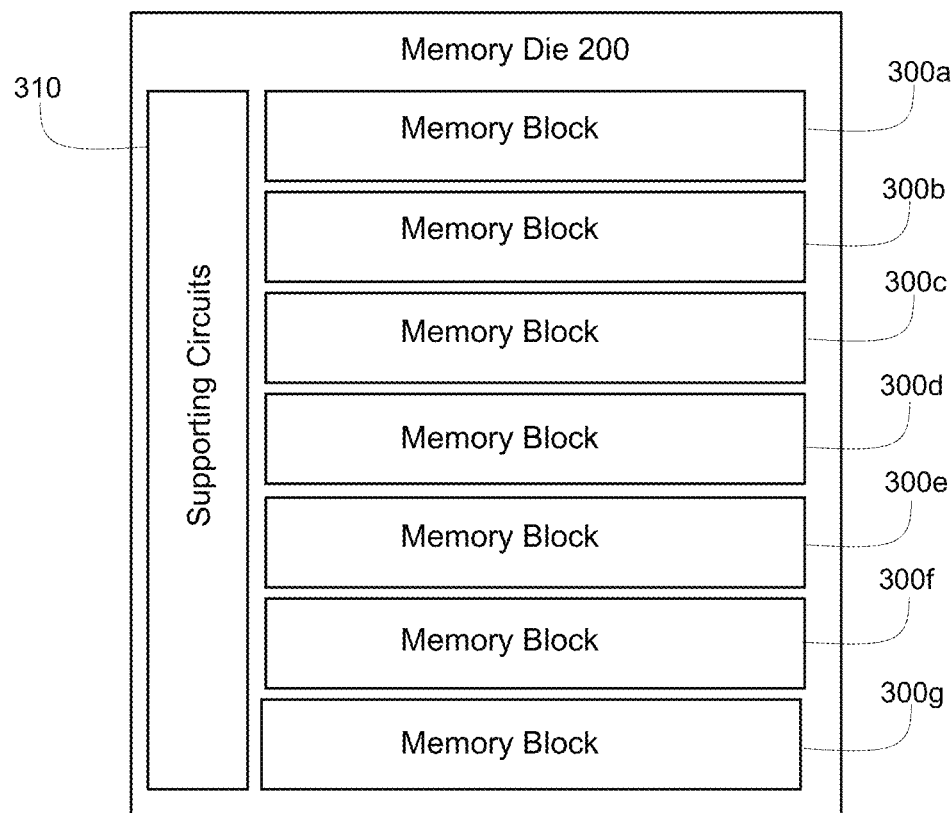
FIG. 3 illustrates a block diagram of an exemplary memory die, according to an embodiment

FIG. 3 illustrates a block diagram of an exemplary internal organization of a memory die, according to an embodiment. The memory die 200 includes memory blocks 300a, 300b, 300c, 300d, 300e, 300f, and 300g. The term "memory block 300" is used herein to refer generally to one of the memory blocks 300a, 300b, 300c, 300d, 300e, 300f, and 300g. The term "memory blocks 300" is used herein to refer collectively to all of the memory blocks 300a, 300b, 300c, 300d, 300e, 300f, and 300g. The number of memory blocks in the memory die 200 shown in FIG. 3 is illustrative and can vary in different implementations. For instance, the memory die 200 can include thousands, or even a larger number, of memory blocks. In the case of Flash NAND, the memory block 300 is the smallest entity that can be erased. Likewise, for other technologies other than Flash NAND, the memory block 300 refers to the smallest entity that can be erased. In a preferred embodiment, operation on the memory die 200 is done at the memory block level. The a memory block must be opened (or in an open memory block state) to store data in it; multiple blocks can be opened at the same time; and, once operations on a block are complete, the memory block is closed (or in a closed memory block state). A memory block in an open memory block state is configured to allow write operations to be performed, while a memory block in a closed memory block state is configured to prevent write operation from being performed. The supporting circuit block 310 includes circuitry for the operation of the memory die 300 and control of the memory blocks 300.

Figure 4:
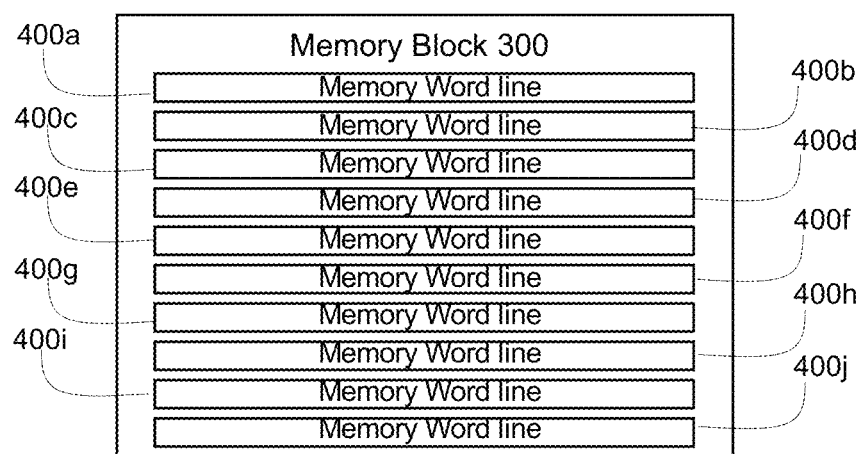
FIG. 4 illustrates a block diagram of exemplary memory block, according to an embodiment.

FIG. 4 illustrates a block diagram of exemplary internal components of a memory block, according to an embodiment. The memory block 300 includes memory word lines 400a, 400b, 400c, 400d, 400f, 400g, 400h, 400i, and 400j. The term "memory word line 400" is used herein to refer generally to one of the memory word lines 400a, 400b, 400c, 400d, 400f, 400g, 400h, 400i, and 400j. The term "memory word lines 400" is used herein to refer collectively to all of the memory blocks 400a, 400b, 400c, 400d, 400f, 400g, 400h, 400i, and 400j. FIG. 4 is an exemplary representation. The number of memory word lines 400 shown in FIG. 4 is illustrative and can vary in different implementations. For instance, the memory word lines 400 can include hundreds or more memory word lines. For data to be stored in a memory word line 400, the memory block 300 must be in the open memory block state.

Figure 5:
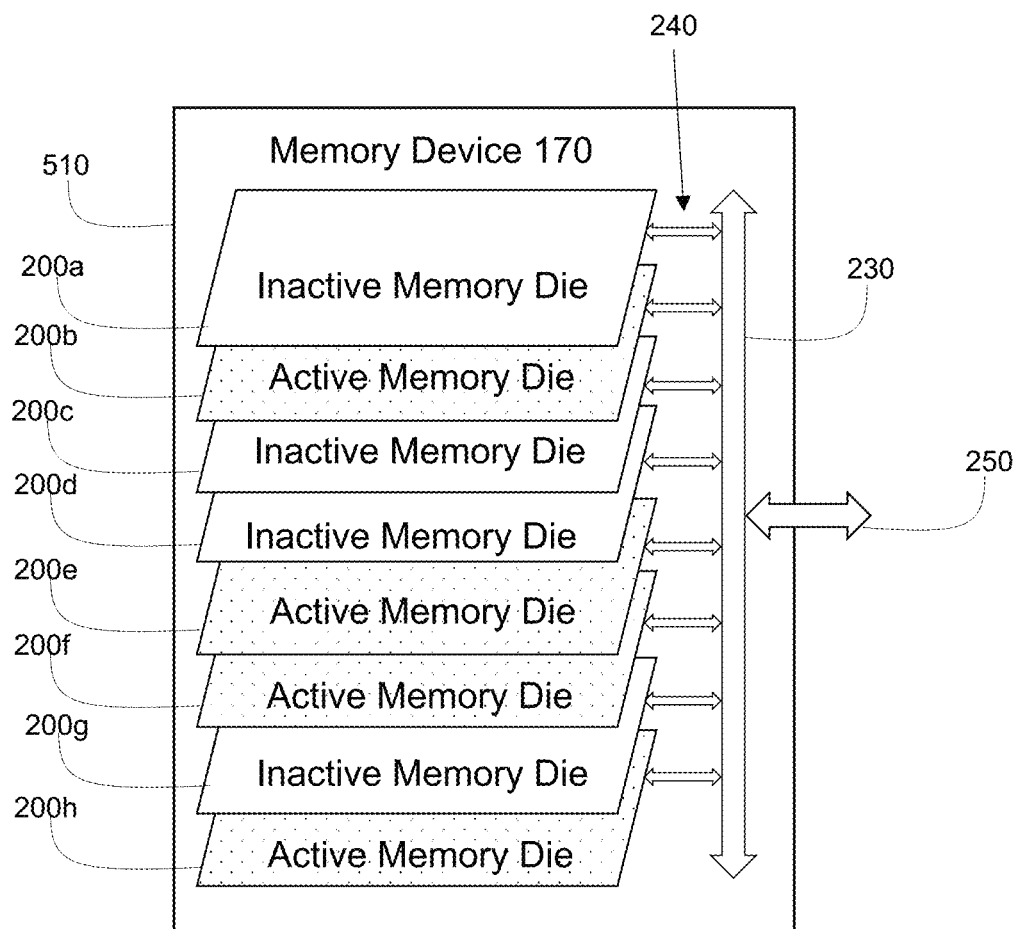
FIG. 5 illustrates a block diagram of an exemplary memory device configured with a stack of active and inactive memory dies, according to an embodiment.

FIG. 5 illustrates a block diagram of the exemplary memory device 170 configured with a stack of active and inactive (or not active) memory dies, according to an embodiment. In FIG. 5, the memory device 170 (e.g., memory package) is shown including the stack of memory dies 200a, 200b, 200c, 200d, 200e, 200f, 200g, and 200h. The memory device 170 is exemplary and not limited to include the number of memory dies 200 shown. The memory device 170 can include any number of memory dies 200 stacked in other implementations. An enclosure 510 houses the stack of memory dies 200. The memory dies 200 are connected to the bus 250 by the dedicated buses 240. The internal bus 230 provides the communication between the memory dies 200 and the external memory device input and output connection through the connector 250.

For illustrative purposes, in FIG. 5, the memory dies 200b, 200e, 200f, and 200h in the memory stack are active (or in an active memory die state) and the memory dies 200a, 200c, 200d, and 200g are inactive (or in an inactive memory die state). The active memory dies 200b, 200e, 200f, and 200h are shown dotted to solely to represent the memory die as being active and not to indicate any physical material difference between the memory dies 200a, 200b, 200c, 200d, 200e, 200f, 200g, and 200h. A memory die is considered active (or in an active memory die state) when it is available for write operations (or when writes are permitted), such as writing data into some of the memory blocks based on a programming scheme. A memory die is inactive (or in an inactive memory die state) when it is unavailable for write operations (or when writes are prevented (or not permitted)). Read operations can still be performed in an active or inactive memory die 200.

When data is to be written to an open memory block in any of the active memory dies 200, the thermal module 131 (e.g., in the controller 130 of the storage system 100 in FIG. 1) determines which memory blocks are currently in an open memory block state that allows for a write operation. Based on the locations of the active memory blocks, the thermal module 131 selects open memory blocks for the write operation so as to reduce heat generated due to the operation being performed on the memory blocks. In an embodiment, the selection of open memory blocks is made in a manner that avoids, or minimizes the number of, neighboring open memory blocks performing write operations simultaneously, thus reducing the cumulative combination of heat being generated by the neighboring open memory blocks when written to.

Figure 6:
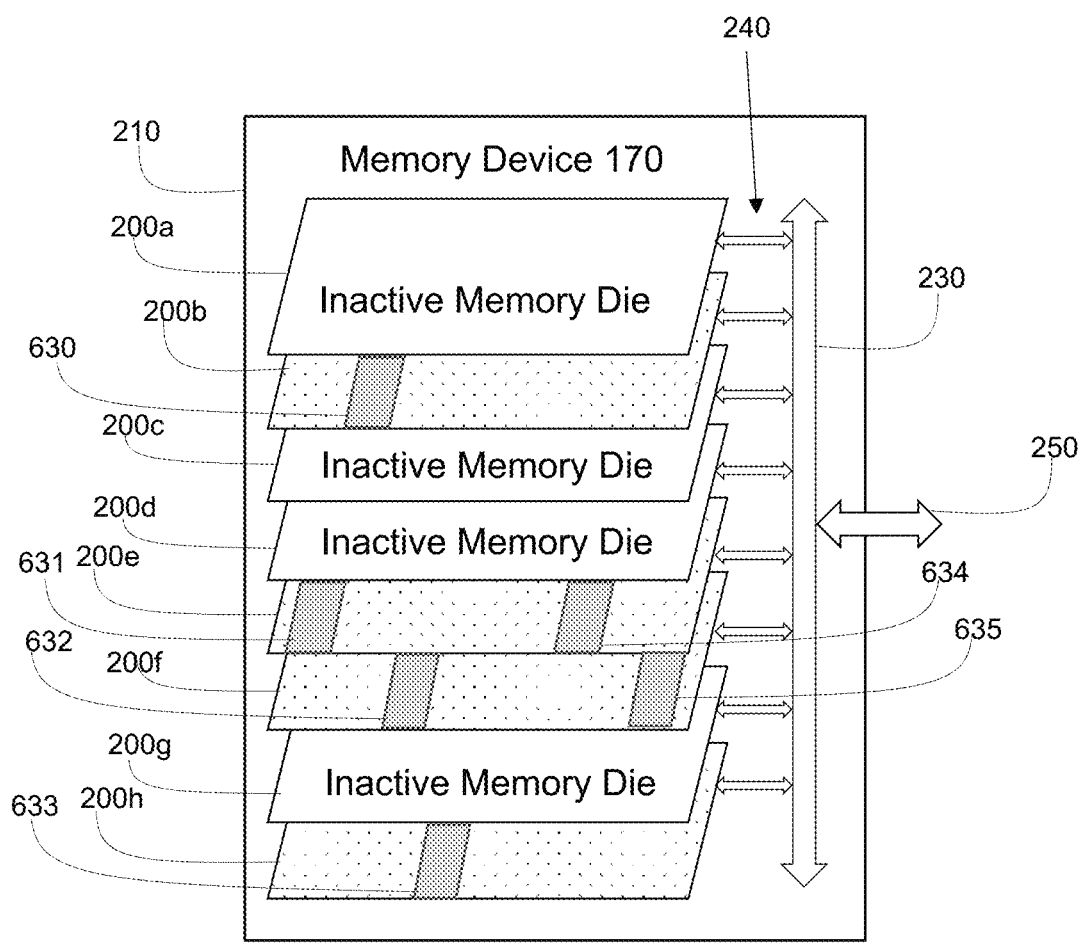
FIG. 6 illustrates a block diagram of an exemplary memory device configured with a stack of active and inactive memory dies, according to an embodiment.

FIG. 6 illustrates a block diagram of an exemplary memory device 170 configured with a stack of active and inactive memory dies, according to an embodiment. In FIG. 6, the memory device 170 is shown including the enclosure 210 and the stack of memory dies 200a, 200b, 200c, 200d, 200e, 200f, 200g, and 200h. The memory device 170 is exemplary and not limited to the number of memory dies 200 shown. The memory device 170 can include any number of memory dies 200 stacked in other implementations. The memory dies 200 are connected to the bus 230 by the dedicated buses 240. The bus 230 is connected to the internal bus 250, which provides the communication between the memory dies 200 and the external memory device input and output connection.

For illustrative purposes, the memory dies 200b, 200e, 200f, and 200h are shown as in an active memory dies state and allow write operations, while the memory dies 200a, 200c, 200d, and 200g are shown in an inactive memory dies state and prevent write operations. In the example shown, the thermal module 131 (e.g., in the controller 130 of FIG. 1) has determined that the specified open memory blocks 630, 631, 632, 633, 634, 635 are the optimal open memory blocks to write to reduce the occurrence of hot spots in the memory device 170. The thermal module 131 can base the determination on, for example, the relative distances between open memory blocks on a single die, between open memory blocks on stacked die, or both. For instance, the thermal module 131 can be programmed to maximize the relative distances between open memory blocks being written to. The greater the relative distance between two open memory blocks, the smaller the cumulative combination of heat that would be generated when writing to both open memory blocks, and thus the smaller likelihood of a hot spot occurring. Once the optimal open memory blocks are selected for a write operation, a write operation can be performed on specific memory locations (e.g., memory word lines 400 in the memory blocks 300). The controller 130 initiates the write operation on the specific memory locations in the optimal open memory blocks that were selected.

Figures 7A, 7B:
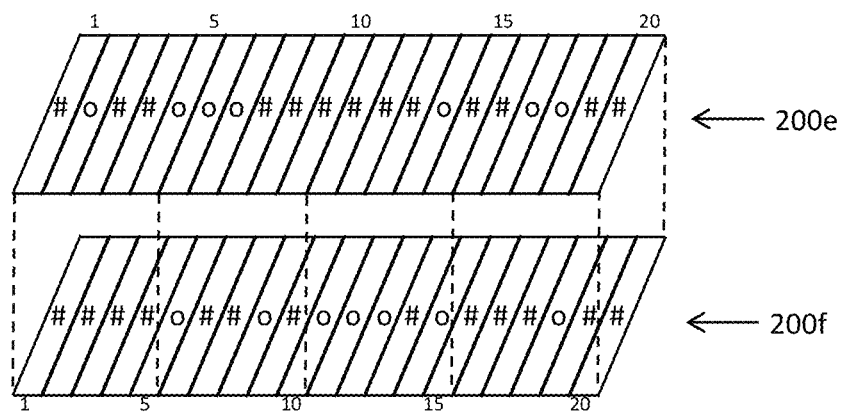
FIG. 7A illustrates a diagram of an exemplary representation of memory blocks within the two adjacently stacked active memory dies shown in FIG. 6, according to an embodiment.
FIG. 7B illustrates a diagram of exemplary state tables used to maintain memory die states and memory block states for the two memory dies shown in FIG. 7B, according to an embodiment.

FIG. 7A illustrates a diagram of an example representation of memory blocks within the two adjacently stacked active memory dies 200e and 200f shown in FIG. 6, according to an embodiment. In FIG. 7A, the active memory die 200f is shown including 20 memory blocks disposed along the memory die 200f. A memory block number is shown at every $5^{th}$ memory block for reference purposes. It should be appreciated that the number of memory blocks (i.e., 20) is illustrative and provided as an example to facilitate understanding. The memory die 200f can include another number of memory blocks (e.g., "n" number of memory blocks) disposed along the memory die in other implementations. The open memory blocks that are in an open memory block state are indicated with the letter "o" inside, and the closed memory blocks that are in a closed memory block state are indicated with the hashtag symbol "#" inside. For example, in the memory die 200f, memory blocks 5, 8, 10-12, 14, and 18 are shown as open memory blocks in the open memory block state.

In general, when performing a write operation on multiple open memory blocks, the relative distances between the open memory blocks can be an indicator of the level of thermal dissipation that will occur because the relative distance and thermal dissipation have a generally proportional relationship. In other words, the greater the relative distance between two open memory blocks (the further away the open memory blocks are), the greater the level of thermal dissipation can be expected during a write operation. The level of thermal dissipation when writing to two open memory blocks can be represented (or estimated) based on the relative distance between the two open memory blocks. Using memory block numbers to represent the sequential positions of the memory blocks along a memory die, the relative distance between two open memory blocks can be approximated (or computed) using their corresponding memory block numbers. It should be appreciated that the memory block numbers can follow any variety of "numbering" systems that allows the sequential position of the memory blocks to be distinguished. For instance, the numbering system can include, but are not limited to integers, physical addresses associated with the locations of the memory blocks (e.g., starting or ending physical address), etc.

As an example for the memory die 200f shown in FIG. 7A, it can be determined (e.g., computed by the thermal control module 131 of the controller 131) that the open memory blocks 5 and 8 are a relative distance of 3 memory blocks away from one another, with 2 memory blocks (memory blocks 6 and 7) separating the two. Similarly, it can be determined that the open memory blocks 8 and 18 are a relative distance of 10 memory blocks away from one another, with 9 memory blocks separating the two. If considering a write operation on only these two sets of open memory blocks in isolation, it can be determined that because the open memory blocks 8 and 18 have a greater relative distance between them (i.e., 10) than the open memory bocks 5 and 8 (i.e., 3), the thermal dissipation is greater when performing the write operation on the open memory blocks 8 and 18. Moreover, in the memory die 200*f* of FIG. 7A, it can be similarly determined that the two open memory blocks that are the greatest relative distance away from each other are the open memory blocks 5 and 18 (relative distance of 13 memory blocks away from one another, with 12 memory blocks separating the two). Thus, for a write operation to only two open memory blocks in the memory die 200*f* in isolation, the two open memory blocks 5 and 18 can be selected to maximize thermal dissipation. On the other hand, if three open memory blocks in the memory die 200*f* are applicable for a write operation, then the relative distances between each of the 3 open memory blocks have to be taken into account to generate the optimal thermal dissipation overall for the 3 selected open memory blocks. Any variety of algorithms can be implemented to determine the optimal thermal dissipation between the three open memory blocks (or more than three open memory blocks). For instance, in one embodiment, the optimal thermal dissipation can be determined by selecting the three open memory blocks that maximizes both: 1) the relative distance from the middle open memory block to the open memory block on one side of the middle open memory block, and 2) the relative distance from the middle open memory block to the open memory block on the other side of the middle open memory block. Moreover, the optimal thermal dissipation can take into account any variety of factors, such as a predetermined threshold distance between two open memory blocks that is considered to generate a hot spot when written to, a predetermined threshold distance between two open memory blocks that is considered to generate minimal or negligible cumulative heat when written to, etc.

Also shown in FIG. 7A is a memory die 200*e* that includes 20 memory blocks disposed along the memory die. A memory block number is shown at every 5$^{th}$ memory block for reference purposes. The open memory blocks that are in an open memory block state are indicated with the letter "o" inside, and the close memory blocks that are in a closed memory block state are indicated with the hashtag symbol "#" inside. As similarly done for the memory die 200*f*, the relative distances between open memory blocks shown in the memory die 200*e* can be determined, and the open memory blocks can be selected for a write operation based on the relative distances between them in order to generate the optimal thermal dissipation.

The memory die states for each memory die and the memory block states for each memory blocks can be maintained in one or more state tables. For instance, the thermal module 131 of the controller 130 of FIG. 1 can maintain and store the state tables in memory, such as in the memory 170 or in another memory (e.g., the on-board memory of the controller 130). FIG. 7B illustrates a diagram of exemplary state tables used to maintain the memory die states and the memory block states for the two memory dies 200*e* and 200*f* shown in FIG. 7B, according to an embodiment. State tables 750 and 751 are shown including a column 701 for die numbers, a column 702 for memory die states, a column 703 for memory block numbers, and a column 704 for memory block states. The table 750 is used to maintain the memory die state of the memory die 200*f* and the memory block states of the 20 memory blocks in the memory die 200*f*. Similarly, the table 751 is used to maintain the memory die state of the memory die 200*e* and the memory block states of the 20 memory blocks in the memory die 200*e*. As an example, row 704 of the table 751 indicates that the memory die state of the memory die 200*e* is active (or in an active memory die state) and the memory block numbered 5 of die number 200*e* is open (or in an open memory block state) and available for a write operation. It should be appreciated that a state table can be included for each of the memory dies 200 in the applicable memory device 170; and further, that all of the state tables can be represented in a single table in another implementation.

In an embodiment, the relative distances between open memory blocks in different memory dies (e.g., adjacent memory dies) can also be determined and used in the selection of the open memory blocks for a write operation. The greater the relative distance between two open memory blocks (the further away the memory blocks are), the greater the level of thermal dissipation that can be expected. For any given memory block within a given memory die, the closest memory block in an adjacent memory die is the memory block that is stacked adjacent to (e.g., directly above or below) the given memory block. The relative distance from the given memory block to the adjacently stacked memory block can be set to 1, for instance. The relative distances to the other memory blocks in the adjacent memory die increases for each successive memory block further away from the adjacent memory block.

For example, the memory dies 200*e* and 200*f* are shown stacked adjacent to one another, with the 20 memory blocks of memory die 200*e* stacked adjacent to the 20 memory blocks of memory die 200*f*. For any given memory block (e.g., the open memory block 5) in memory die 200*f*, the closest memory block in the memory die 200*e* is the similarly numbered memory block (e.g., the open memory block 5) because it is stacked adjacent to (e.g., directly above) the given memory block. For example, the relative distance between the two adjacent open memory blocks 5 in the memory dies 200*f* and 200*e* can be determined to be 1. For each successive memory block away from the open memory block 5 in the memory die 200*e*, the relative distances to the open memory block 5 in the memory die 200*f* increases. For instance, each of the memory blocks 4 and 6 of the memory die 200*e* have a relative distance of 2 to the memory block 5 of the memory die 200*f*; each of the memory blocks 3 and 7 of the memory die 200*e* have a relative distance of 3 to the memory block 5 of the memory die 200*f*; and so on for the remaining memory blocks of the memory die 200*e*. Greater relative distances can be associated with greater levels of thermal dissipation. The relative distances between open memory blocks in different memory dies may sometimes be referred to herein as "vertical" relative distances, and the relative distances between open memory blocks in the same memory die may sometimes be referred to herein as "horizontal" relative distances.

As an example, consider a write operation that requires 4 memory blocks and only the two memory dies 200*e* and 200*f* are available. Two memory blocks from each of the memory dies 200*e* and 200*f* can be used to perform the write operation to increase relative distances and in turn increase thermal dissipation. In memory die 200*f*, the open memory blocks 5 and 18 can be determined to generate the lowest level of thermal dissipation over any other two open memory blocks in the memory die 200*e* based on having the greatest relative distance between them. In an effort to optimize (e.g., maximize) thermal dissipation, the open memory blocks 2 and 14 of the memory die 200e can be selected based on the resulting large relative distances of both to the memory blocks 5 and 18 of the memory die 200f.

Various rules and procedures can be created to select multiple memory blocks for write operations in a manner that increases or maximizes thermal dissipation. Algorithms capturing the rules and procedures can be implemented in firmware for the thermal module 131 in the controller 130, for example. The rules and procedures can be based on (or account for) any variety of factors, such as the position of the active memory dies (e.g., the greater the relative distance between two active memory dies, the greater the thermal dissipation); the relative distances between open memory blocks in an active memory die; the relative distances between open memory blocks in two different memory dies (e.g., adjacent memory dies); or any other factor relating the position of the memory dies or memory blocks. In one embodiment, the optimal thermal dissipation for three or more open memory blocks over two or more memory dies can be determined based on any combination of factors that can be considered for priority selection or used in a weighted score. Example factors can include, but are not limited to: relative distances between all three open memory blocks (e.g., a higher priority or weight for the open memory blocks with larger relative distances between all three open memory blocks), a predetermined threshold distance between two open memory blocks that is considered to generate a hot spot when written to (e.g., lower priority or weight for open memory blocks within the predetermined threshold and considered to generate a hot spot), a predetermined threshold distance between two open memory blocks that is considered to generate minimal or negligible cumulative heat when written to (e.g., higher priority or weight for open memory blocks exceeding the predetermined threshold distance and considered to generate a minimal or negligible cumulative heat when written to), etc. The factors can relate to open memory blocks in the same memory die, to open memory blocks in different dies, or both. For example, in an embodiment, the predetermined threshold distances for open memory blocks in the same memory die can be set to a different value than the predetermined threshold distances for open memory blocks in different memory dies.

Figure 8:
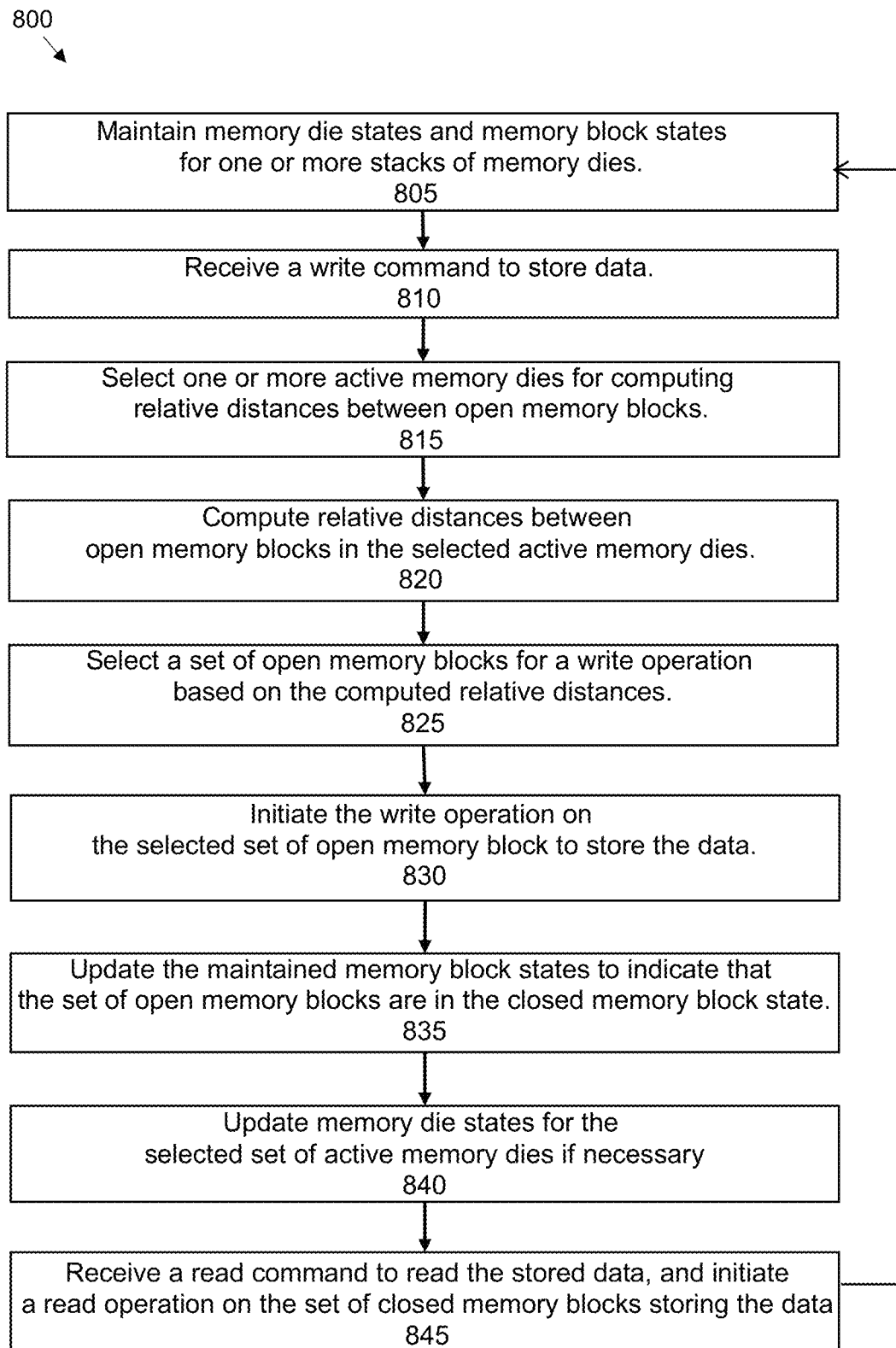
FIG. 8 illustrates a flowchart for an exemplary method of managing thermal dissipation in multi-stacked dies, according to an embodiment.

FIG. 8 illustrates a flowchart for an exemplary process 800 of managing thermal dissipation in multi-stacked dies, according to an embodiment. In some aspects, the process 800 is performed by a processing component. The processing component can be implemented as any of a variety of structures or devices, such as one or more controllers (or microcontrollers), processors (or microprocessors), software modules and hardware modules, special-purpose hardware (e.g., application specific hardware, ASICs, DSPs, etc.), embedded controllers, hardwired circuitry, hardware logic, etc. In an embodiment, the processing component can be implemented as the controller 730 of FIG. 1, which is provided as an illustrative example embodiment for the process 800. It should be appreciated that common features and functions described for FIGS. 1-7 may be equally applicable for FIG. 8 and are all not necessarily repeated here again for the sake of clarity and brevity.

The multi-stacked dies can include one or more stacks of memory dies included within a single memory device (e.g., the memory device 170) or within multiple memory devices (e.g., multiple memory devices 170). The memory devices can include an embedded or non-embedded implementation. The memory dies each include a plurality of memory blocks for storing data. The processing component is coupled to the one or more stacks of memory dies and can perform read and write operations on the plurality of memory blocks. The memory dies can include one or more memory technologies, such as one or more non-volatile technologies, or one or more non-volatile and volatile memory technologies. Example memory technologies can include, but are not limited to: planar NAND Flash, 3D NAND Flash, ReRAM, MRAM, etc. The processing component can be coupled to a host interface that enables the processing component to communicate with a host, such as to receive read and write commands from the host.

At block 805 of the process 800, memory die states and memory block states are maintained for the one or more stacks of memory dies. The one or more stacks of memory dies can be included within a single memory device or within multiple memory devices. The memory die states refer to the memory dies and can be active or inactive. An active memory die state allows write operations to be performed in a memory die and an inactive memory die state prevents write operations from being performed in a memory die. The memory block states refer to the memory blocks within the memory dies and can be open or closed. An open memory block state allows write operations to be performed in a memory block and a closed memory block state prevents write operations from being performed in a memory block. The active and inactive memory die states and the open and closed memory block states apply to write operations. Read operations can be performed in any of the active and inactive memory die states and the open and closed memory block states. In an embodiment, the memory dies states and the memory block states are maintained in state tables, such as the state tables 751 and 752 of FIG. 7B for instance.

In an embodiment, two or more memory technologies can be implemented in different stacks of memory dies, or in different memory dies of a stack. The memory block size may vary by memory technology and such variations do not undermine the underlying principles of the techniques described herein. In an embodiment, the block 805 is performed by the thermal module 131 of FIG. 1. The state tables can be stored in memory coupled to the controller 130, such as memory coupled to controller 130 or on-board memory integrated within the controller 130 (not shown in FIG. 1). A stack of memory dies can be implemented in the memory devices 170. At block 810, a write command to store data is received. For example, the controller 130 of FIG. 1 can receive a write command to store data from the host (e.g., the host 150).

At block 815, one or more active memory dies are selected for computing relative distances between open memory blocks within the one or more active memory dies. In an embodiment, the block 815 is performed by the thermal module 131 of the controller 130 of FIG. 1. For example, the thermal module 131 can identify which memory dies (e.g., the memory dies 200) are active by accessing state tables (e.g., state tables 651 and 652) that are stored in memory. The one or more active memory dies can be located in, and selected from, a single stack of memory dies (e.g., in a single memory device 170). If more than one stack is available, then one of the stacks is selected and then the one or more active memory dies are selected from the active memory dies present in the selected stack. Alternatively, the one or more active memory dies can be located in, and selected from, multiple stacks of memory dies (e.g., in multiple memory devices 170). In such case, specific stacks are selected and then the one or more active memory dies are selected from the selected stacks. A separate set of relative distances can be computed for the open memory blocks within each stack of memory dies (e.g., within different memory devices). For example, one or more active memory dies from a first stack of memory dies can be selected for computing the relative distances between a plurality of open memory blocks in the first stack. Further, one or more active memory dies form a second stack of memory dies can be selected for computing the relative distances between a plurality of open memory blocks in the second stack. Alternatively, one set of relative distances can be determined for the open memory blocks of multiple stacks of memory dies.

In an embodiment, the one or more stacks can be selected based on any variety of factors that can be considered for priority selection or used in a weighted score for selection. Example factors can include, but are not limited to: the position of the stack (e.g., stacks farther apart, or non-adjacent, having higher priority or weight), the number of active memory dies in a stack (e.g., stacks with larger numbers having higher priority or weight), the number of open memory blocks in a stack (e.g., stacks with larger numbers having higher priority or weight), the number of open memory blocks in one or more memory dies of a stack (e.g., stacks with larger numbers having higher priority or weight), etc.

The number of active memory dies that are selected for the computation of relative distances can be determined based on various factors, such as the number of open memory blocks required for the write operation (e.g., computed based on the size of the data and the size of the open memory blocks), the number of open memory blocks to be used per memory die, etc. In an embodiment, the number of active memory dies selected for the computation can be equal to the number of active memory dies required for the write operation. In another embodiment, the number of active memory dies selected for the computation can be greater than the number of active memory dies required for the write operation.

Which active memory dies are selected for the computation of relative distances can be determined based on various factors that can be considered for priority selection or used in a weighted score for selection. Example factors can include, but are not limited to: the number of open memory blocks in an active memory die (e.g., the active memory dies with larger numbers having higher priority or weight), the frequency of recent write operations on an active memory die (e.g., the active memory dies with lower frequencies having higher priority or weight), how close active memory dies are from one another (e.g., active memory dies farther apart, or non-adjacent, having higher priority or weight), the memory technology implemented in the memory die (e.g., the active memory dies having the most suitable memory technology having higher priority or weight), etc. In one embodiment, the active memory dies can be selected irrespective of how close they are to one another (e.g., adjacent to one another). In another embodiment, the active memory dies can be selected in a manner that reduces the number of adjacent memory dies selected to reduce or minimize thermal dissipation.

In one embodiment, the thermal module 131 can determine when an active memory die is almost full (e.g., reached a predetermined threshold value) or completely full, and then change the memory die state to inactive. In an embodiment, the thermal module 131 can change the memory dies state from inactive to active by cleaning up the memory die (e.g., erasing memory blocks within the memory die). In this way, the thermal module 131 can generate more active memory dies when desired or needed.

At block 820, relative distances between open memory blocks in the one or more active memory dies (selected in the block 815) are computed. Various combinations of relative distances can be computed between any given number of open memory blocks in the selected memory dies. For example, for each given open memory block, a relative distance to every other given open memory block can be computed. The number of open memory blocks selected for the computation can vary in different implementations as desired. For instance, if a memory die has 400 open memory blocks, the relative distances computation can be performed for: all open memory blocks (e.g., 400), 200 open memory blocks, 10 open memory blocks, or any other number of open memory blocks as desired.

The relative distances can be computed for open memory blocks within the same memory die. In an embodiment, relative distances can also be computed for memory blocks in different memory dies (e.g., adjacent memory dies). The number of different memory dies selected for the computation can vary in different implementations as desired. In one embodiment, relative distances can be computed for open memory blocks in a single stack of memory dies (e.g., in a single memory device 170). In another embodiment, the relative distances can be computed for open memory blocks in more than one stack of memory dies (e.g., in multiple memory devices 170). For example, relative distances can be computed for open memory blocks in one stack, while relative distances are also computed for open memory blocks in another stack. It should be understood that relative distances can be computed for more than two stacks as well. In an embodiment, the block 820 is performed by the thermal module 131 of FIG. 1. The thermal module 131 can access state tables (e.g., the state tables 651 and 652) to identify the open memory blocks in the selected active memory dies and to select which open memory blocks to use for the relative distances computation.

At block 825, a set of open memory blocks is selected for the write operation based on the computed relative distances. The term "set" as used herein can include one or more elements in the set. For example, the "set" of open memory blocks can include one or more open memory blocks. The number of open memory blocks in the set can be determined based on the number of memory blocks required for the write operation. The set of open memory blocks is selected from the open memory blocks used in the relative distances computation in the block 820.

The set of open memory blocks can be selected based on the computed relative distances from the block 820 so as to manage thermal dissipation, such as to increase or optimize thermal dissipation associated with the write operation. For example, the relative distances can be used to approximate the level of thermal dissipation for various possible combinations of open memory blocks. For example, the smaller the relative distance between two open memory blocks, the smaller the level of the thermal dissipation can be assumed. And vice versa for a larger relative distance and larger thermal dissipation. For more than two open memory blocks, the smaller relative distances when viewed overall (or collectively), the smaller the overall thermal dissipation for the collective open memory blocks can be assumed. And vice versa for larger relative distances and larger thermal dissipation. In an embodiment, the set of open memory blocks are selected based on the relative distances between open memory blocks in a single memory die. In another embodiment, the set of open memory blocks are also selected based on the relative distances between open memory blocks in different memory dies (e.g., adjacent memory dies) within the same stack.

In embodiments where relative distances are computed for open memory blocks in multiple stacks of dies, a set of open memory blocks for writing the data can be selected based on the computed relative distances from multiple stacks of dies. For example, relative distances can be computed for open memory blocks in a first stack and used to select a set (or subset) of open memory blocks in the first stack, while relative distances can be also computed for open memory blocks in a second stack and used to select another set (or subset) of open memory blocks in the second stack. In such case, for example, a portion of the data can be written to the selected set of open memory blocks in the first stack, while another portion of the data can be written to the selected set of open memory blocks in the second stack. Alternatively, the relative distances computed for the first and second stacks can be used to select one set of open memory blocks from one of the stacks to write the data to. For instance, the stack with the set of open memory blocks having more optimal relative distances for thermal dissipation can be selected.

All of the relative distances can be considered for various combinations of the open memory blocks needed for the write operation. In this way, the specific memory blocks selected for the set will have relative distances that generate an optimal (e.g., maximum or increased) thermal dissipation overall. In an embodiment, various scores (or priorities) can be generated and used to select the set of open memory blocks for the write operation. For example, scores can be generated for the relative distances computed for the open memory blocks in the block 820. These scores can represent levels of thermal dissipation based on the relative distances between open memory blocks. For instance, a larger relative distance between two open memory blocks can correspond to a greater score, which represents a greater thermal dissipation. Scores can be generated "horizontally" for open memory blocks within the same memory die. In an embodiment, scores can also be generated "vertically" for open memory blocks in different memory dies (e.g., adjacent memory dies). In an embodiment, the various scores can be weighted. For example, a greater weight can be given to scores for memory blocks within the same memory die, and lesser weight to scores for memory blocks in different memory dies. Any variety and combination of factors can be used to generate a score used to select the set of open memory blocks. Example factors can include, but are not limited to: relative distances between two or more open memory blocks (e.g., a higher priority or weight for the open memory blocks with larger relative distances between all open memory blocks), a predetermined threshold distance between two open memory blocks that is considered to generate a hot spot when written to (e.g., lower priority or weight for open memory blocks within the predetermined threshold and considered to generate a hot spot), a predetermined threshold distance between two open memory blocks that is considered to generate minimal or negligible cumulative heat when written to (e.g., higher priority or weight for open memory blocks exceeding the predetermined threshold distance and considered to generate a minimal or negligible cumulative heat when written to), etc. For example, the predetermined threshold distances can be used to select the set of open memory blocks for the write operation. For instance, for the predetermined threshold distance between two open memory blocks that is considered to generate minimal or negligible cumulative heat when written to, the predetermined threshold distance can represent a sufficient distance where thermal dissipation has reached an acceptable level. For instance, if the predetermined threshold distance is set to 10 (e.g., using the exemplary relative distances described for the example in FIG. 7A), then any open memory blocks with relative distances of 10 or greater can be determined to have an acceptable level of thermal dissipation, making them equally desirable for selection (e.g., have the same score). Similarly, for the predetermined threshold distance between two open memory blocks that is considered to generate a hot spot when written to, the predetermined threshold distance can represent a distance where thermal dissipation is an unacceptable level or lowest priority level. For instance, if the threshold relative distance is set to 3 (e.g., using the exemplary relative distances described for the example in FIG. 7A), then any open memory blocks with relative distances of 3 or less can be determined to have an unacceptable level or lowest priority level of thermal dissipation and not considered for selection unless a more optimal open memory block is not available. It should be appreciated that the scoring factors can relate to open memory blocks in the same memory die, to open memory blocks in different dies, or both. For example, in an embodiment, the predetermined threshold distances for open memory blocks in the same memory die can be set to a different value than the predetermined threshold distances for open memory blocks in different memory dies.

In one embodiment, the selection of the set of open memory blocks can be based on a maximum number of open memory blocks per memory die for the write operation. For example, the set of open memory blocks can be selected such that 2 or less open memory blocks are selected per memory die for the write operation. This is an illustrative example and any other maximum number of open memory blocks can be implemented. The maximum number of open memory blocks used per memory die can vary based on memory technology. In one embodiment, the maximum number of open memory blocks per memory die can be predetermined. In another embodiment, the maximum number of open memory blocks per memory die can be determined on the fly to achieve an optimal number for thermal dissipation based on various factors, such as the number of open memory blocks required for the write operation, the number of open memory blocks in the memory dies, the locations of the open memory blocks (e.g., the memory block numbers), etc. In yet another embodiment, no maximum number of open memory blocks per die is implemented.

The set of open memory blocks that is selected for the write operation is collectively disposed across a set of active memory dies. Put another way, each active memory die in the set of active memory dies includes one or more open memory blocks in the set of open memory blocks, and each open memory block in the set of open memory blocks is disposed on one of the active memory dies in the set of active memory dies. The "set" of active memory dies can include one or more sets (or subsets of active memory dies). For example, the set of open memory blocks can span two stacked dies. In such case, for example, the set of open memory blocks can be collectively disposed across a set of active memory dies including a first set (or subset) of active memory dies in one stack and a second set (or subset) of active memory dies in the other stack. It should be appreciated that the set of open memory blocks can span more than two stacked dies in a similar fashion.

In one embodiment, the set of open memory blocks can be selected in a manner that accounts for the thermal dissipation associated with the set of active memory dies. For instance, the set of open memory blocks can be selected to minimize the number of adjacent memory dies within the set of active memory dies. The set of active memory dies can include one or more active memory dies. Furthermore, the set of active memory dies can be equal to, or a subset of, the one or more active memory dies selected in the block 815 for computing relative distances.

The set of open memory blocks selected for the write operation can be disposed in a single stack of memory dies (e.g., in a single memory device 170). In an embodiment, multiple sets of open memory blocks for more than one stack of memory dies (e.g., in multiple memory devices 170) can be selected for the write operation. For example, for the write operation, one set of open memory blocks can be selected for one stack, while another set of open memory blocks can be selected for another stack. In an embodiment, the block 825 is performed by the thermal module 131 of the controller 130 of FIG. 1.

At block 830, the write operation is initiated on the set of open memory blocks selected at the block 825. In this way, the data from the write command of the block 810 is written to the set of open memory blocks from the block 825. In some instances, the write operation can be performed on single stack of memory dies (e.g., in a single memory device 170). In other instances, the write operation can include two write operations performed on more than one stack of memory dies (e.g., in multiple memory devices 170) with portions of the data stored on different stacks. For example, a first write operation can include a portion of the data written to one set of open memory blocks in one stack, and a second write operation can include another portion of the data written to another set of open memory blocks in another stack. In an embodiment, the block 830 is performed by the controller 130 of FIG. 1

At block 835, the maintained memory block states are updated, in response to the write operation, to indicate a change of the set of open memory blocks from the open memory block state to the closed memory block state. For example, the corresponding state tables for the set of open memory blocks that were written to in the block 830 (or the sets of open memory blocks if written to multiple stacks) can be updated to indicate that the set of open memory blocks are now in the closed memory block state. In an embodiment, the block 835 is performed by the thermal module 131 of the controller 130 of FIG. 1.

At block 840, memory die states for the set of active memory dies identified in the block 825 are updated if necessary. For example, a determination can be made as to whether to update any memory die states for the set of active memory dies identified in the block 825. Because the memory block states for the set of open memory blocks were changed to a closed memory block state in the block 835, the corresponding set of active memory dies are reassessed to determine whether they should remain active or be changed to an inactive memory die state. The determination can be based on various factors, such as how many open memory blocks are available (or remain) in the active memory die. For example, a rule can be established such that an active memory die state is changed to an inactive memory die state when a predetermined minimum threshold number of open memory blocks is reached, such as 50 or less, 3 or less, 0, or any other predetermined minimum threshold amount. Other various rules or factors can be established as desired in other implementations. If an update is required, the state tables for the corresponding set of active memory dies can be updated accordingly. In an embodiment, the block 840 is performed by the thermal module 131 of the controller 130 of FIG. 1.

At block 845, a read command is received to read the data stored in block 830 for the write command of block 810, and a read operation is initiated accordingly on the set of open memory blocks that are now in a closed memory block state and that now store the data from blocks 830 and 835. In an embodiment, the block 845 is performed by the thermal module 131 of the controller 130 of FIG. 1. For instance, the read command can be sent by the host 150 to the controller 130, and the thermal module 131 initiate the read operation on the set of closed memory blocks storing the data from blocks 830 and 835.

The process can be repeated for any subsequent read or write commands received, as represented by the arrow from the block 850 to the block 805. In an embodiment, the block 840 is performed by the thermal module 131 of the controller 130 of FIG. 1. Subsequent write commands for other data can be sent by the host 150 and received by the controller 130, for instance.

Figure 9:
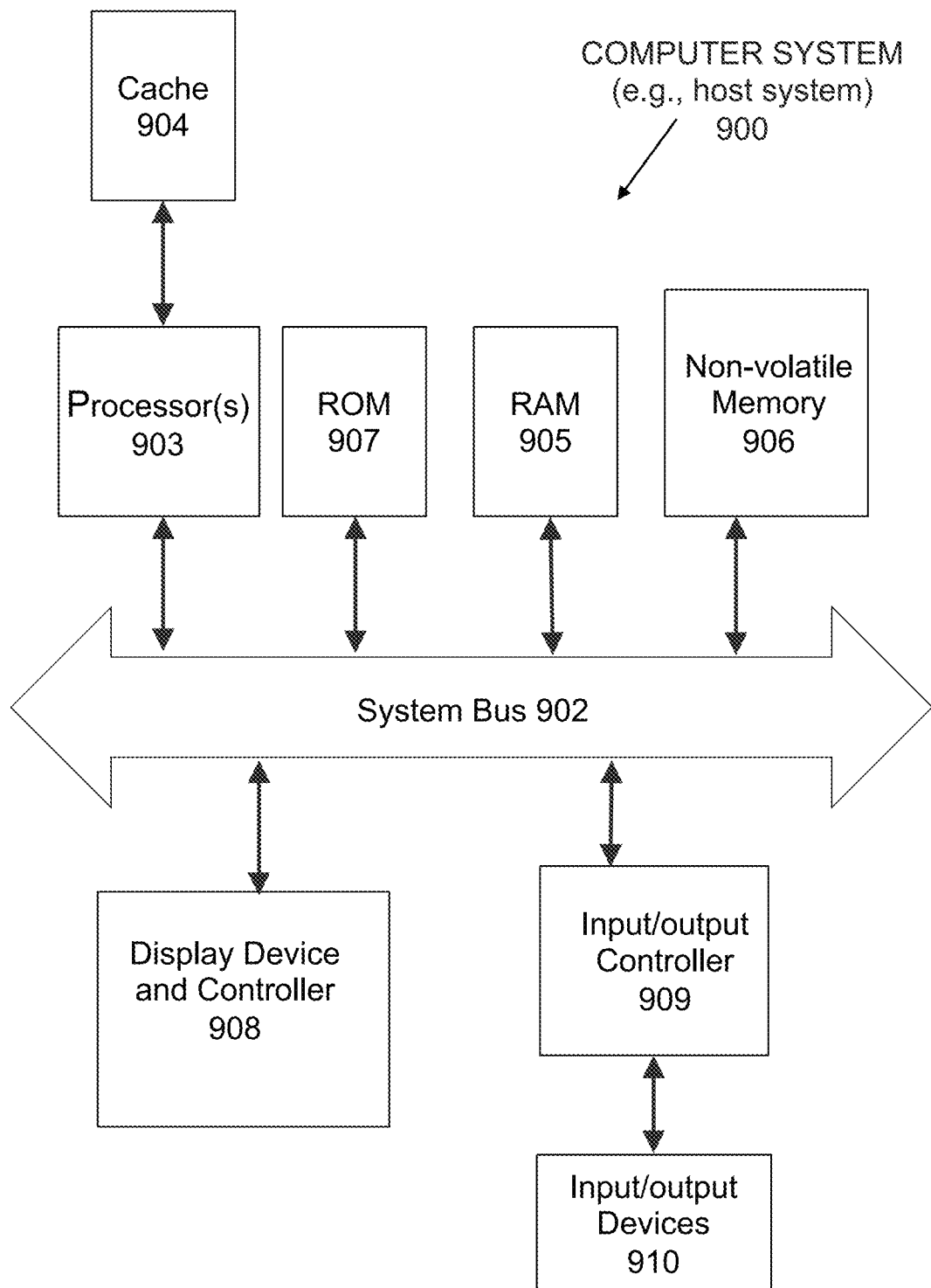
FIG. 9 depicts a block diagram of an exemplary host or computer system, according to an embodiment.

FIG. 9 illustrates a block diagram of an exemplary computer system (or data processing system), according to an embodiment. Note that while FIG. 9 illustrates various components of a computer system, it is not intended to represent any particular architecture or manner of interconnecting the components. The computer system 900 shown in FIG. 9 may represent an example host (e.g., the host 150 in FIG. 1). It is also appreciated that computer system 900 is exemplary and can include fewer components, or more components than those show in FIG. 9. As shown, the computer system 900 includes a system bus 902, which is coupled to a microprocessor 903, a Read-Only Memory (ROM) 907, a volatile Random Access Memory (RAM) 905, as well as other nonvolatile memory 906. In the illustrated embodiment, microprocessor 903 is coupled to cache memory 904. A system bus 902 can be adapted to interconnect these various components together and also interconnect components 903, 907, 905, and 906 to other devices, such as a display controller and display device 908, and to peripheral devices such as input/output ("I/O") devices 910. Types of I/O devices can include keyboards, modems, network interfaces, printers, scanners, video cameras, storage drives (e.g., solid-state storage drives, removable USB drives, etc.) or other devices well known in the art. Typically, I/O devices 910 are coupled to the system bus 902 through I/O controllers 909. In one embodiment the I/O controller 909 includes a Universal Serial Bus ("USB") adapter for controlling USB peripherals or other type of bus adapter. RAM 905 can be implemented as dynamic RAM ("DRAM"), which requires power continually in order to refresh or maintain the data in the memory. The other nonvolatile memory 906 can include a magnetic hard drive, magnetic optical drive, optical drive, DVD RAM, solid-state storage drive, or other type of memory system that maintains data after power is removed from the system. In some instances, the computer system 900 can use a nonvolatile memory remote from the system, such as a network storage device coupled with the host system through a network interface, such as a modem, Ethernet interface, or any other standard or proprietary interface. In one embodiment, the techniques described herein can be implemented by a storage system (e.g., the controller 130 of the system 100 of FIG. 1) coupled to the computer system 900 functioning as a host (e.g., the host 150 of FIG. 1). In another embodiment, the processor 903 of the computer system 900 can implement one or more techniques described herein on memory coupled to the processor 903.

Figure 10:
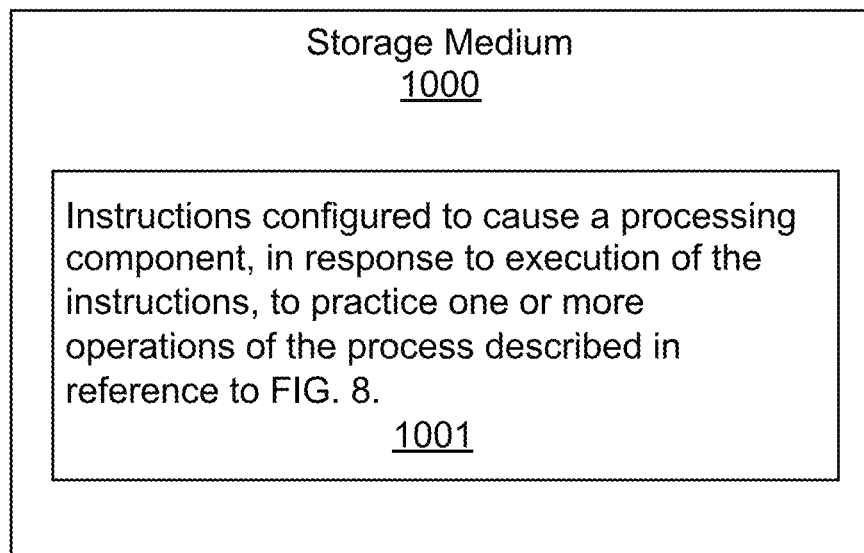
FIG. 10 illustrates an exemplary non-transitory computer-readable storage medium having instructions configured to practice aspects of the process of FIG. 8, in accordance with an embodiment.

FIG. 10 illustrates an exemplary storage medium 1000, according to an embodiment. The storage medium 1000 can include an article of manufacture. The storage medium can include one or more non-transitory computer-readable (or machine-readable) storage media, such as optical, magnetic, or semiconductor storage. The storage medium 1000 can store various type of computer-executable instructions, such as instructions 1001 to perform some or all of the operations for the process 800 of FIG. 8. In one embodiment, the instructions can be executed by a processing component (e.g., the controller of FIG. 1) of a storage system (e.g., storage system 100). Examples of non-transitory computer-readable storage media can include any tangible media or mechanism is capable of storing data (e.g., computer-executable instructions) in a form accessible by a computer or a processing component, such as volatile memory or non-volatile memory, removable or non-removable memory, erasable or non-erasable memory, writeable or re-writeable memory, etc. A computer-readable storage medium can also include a storage or database from which content can be downloaded. Example computer-readable instructions can include, but are not limited to, any suitable type of code, such as source code, compiled code, dynamic code, object-oriented code, visual code, difference code (e.g., "delta" or "patch" code), etc. The computer-readable medium can include a non-transitory storage medium to store logic. In some examples, the logic can include, but are not limited to, various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof. The examples are illustrative and are not limited in this context.

Throughout the foregoing description, and for the purposes of explanation, numerous specific details are set forth in order to provide a thorough understanding of the described techniques. It will be apparent, however, to one skilled in the art that these techniques can be practiced without some of these specific details. Although various embodiments that incorporate these teachings have been shown and described in detail, those skilled in the art could readily devise many other varied embodiments or mechanisms to incorporate these techniques. Also, embodiments can include various operations as set forth above, fewer operations, or more operations, or operations in another order. Accordingly, the scope and spirit of the invention should only be judged in terms of any accompanying claims that may be appended, as well as any legal equivalents thereof.

Reference throughout the specification to "one embodiment" or "an embodiment" is used to mean that a particular feature, structure or characteristic described in connection with an embodiment is included in at least one embodiment. Thus, the appearance of the expressions "in one embodiment" or "in an embodiment" in various places throughout the specification are not necessarily referring to the same embodiment. Further, the particular features, structures or characteristics may be combined in any suitable manner in one or several embodiments. Although the present invention has been described above with reference to specific embodiments, it is not intended to be limited to the specific form set forth herein. Rather, embodiments other than those specific described above are equally possible within the scope of any accompanying claims. Moreover, it should be appreciated that the terms "comprise/comprises" or "include/includes", as used herein, do not exclude the presence of other elements or steps. Furthermore, although individual features may be included in different claims, these may possibly advantageously be combined, and the inclusion of different claims does not imply that a combination of features is not feasible and/or advantageous. In addition, singular references do not exclude a plurality. Finally, reference signs in the claims are provided merely as a clarifying example and should not be construed as limiting the scope of the claims in any way.

Various components, modules, and examples described herein may include software elements, hardware elements, or a combination of software and hardware elements. Examples of hardware elements may include one or more of the following: devices, logic devices, components, processors (or microprocessors, embedded processors, multi-core processors, etc.), controllers (or microcontrollers, embedded controllers, etc.), hard-wired circuits, processor circuits, circuit elements (e.g., transistors, resistors, capacitors, inductors, and so forth), integrated circuits, special-purpose hardware (e.g., application specific integrated circuits (ASIC), programmable logic devices (PLD), digital signal processors (DSP), field programmable gate array (FPGA)), memory units, hard-wired logic, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with the application.

Software content (e.g., data, instructions, and configuration) may be provided via an article of manufacture including a non-transitory, tangible computer-readable (or machine-readable) storage medium, which provides content that represents instructions that can be executed by a processing component. The content may result in a computing (or data processing) device performing various functions/operations described herein. Examples of non-transitory computer-readable storage media can include any tangible media or mechanism is capable of storing data (e.g., computer-executable instructions) in a form accessible by a computer or a processing component, such as volatile memory or nonvolatile memory, removable or non-removable memory, erasable or non-erasable memory, writeable or re-writeable memory, etc. A computer-readable storage medium can also include a storage or database from which content can be downloaded. Example computer-readable instructions can include, but are not limited to, any suitable type of code, such as source code, compiled code, dynamic code, object-oriented code, visual code, difference code (e.g., "delta" or "patch" code), etc. The computer-readable medium can include a non-transitory storage medium to store logic. In some examples, the logic can include, but are not limited to, various software elements, such as software components, programs, applications, computer programs, application programs, system programs, machine programs, operating system software, middleware, firmware, software modules, routines, subroutines, functions, methods, proce-

What is claimed is:

1. A system for managing thermal dissipation in multi-stacked memory dies, the system comprising:
    a first plurality of memory dies in a stacked configuration, the first plurality of memory dies comprising a first plurality of memory blocks to store data; and
    a processing component coupled to the first plurality of memory dies, wherein the processing component is configured to:
        maintain memory block states for the first plurality of memory blocks, wherein the memory block states comprise:
            an open memory block state allowing write operations; and
            a closed memory block state preventing write operations;
        receive a first write command to store first data;
        compute first relative distances between a first plurality of open memory blocks, wherein the first plurality of open memory blocks are in the open memory block state, and wherein the first plurality of memory dies comprises the first plurality of open memory blocks;
        select a first set of open memory blocks for a first write operation, wherein the first write operation is for storing the first data, wherein the first set of open memory blocks is selected from the first plurality of open memory blocks, and wherein the first set of open memory blocks is selected based on the first relative distances so as to manage thermal dissipation; and
        initiate the first write operation on the first set of open memory blocks.

2. The system of claim 1, wherein the processing component is further configured to update the maintained memory block states, in response to the first write operation, to indicate a change of the first set of open memory blocks from the open memory block state to the closed memory block state.

3. The system of claim 2, wherein the processing component is further configured to:
    maintain memory die states for the first plurality of memory dies, wherein the memory die states comprise:
        an active memory die state allowing write operations; and
        an inactive memory die state preventing write operations; and
    select one or more active memory dies for the computing of the first relative distances between the first plurality of open memory blocks;
    wherein the selected one or more active memory dies:
        are in the active memory die state;
        are selected from the first plurality of memory dies; and
        comprise the first plurality of open memory blocks;
    wherein the first set of open memory blocks are collectively disposed across each of a first set of active memory dies; and
    wherein the selected one or more active memory dies comprise the first set of active memory dies.

4. The system of claim 3, wherein the processing component is further configured to update the maintained memory die states to indicate a change to the inactive memory die state for any of the first set of active memory dies that reaches a predetermined minimum threshold number of open memory blocks remaining.

5. The system of claim 3, wherein the selecting of the first set of open memory blocks is further based on reducing adjacent memory dies so as to manage thermal dissipation.

6. The system of claim 1, wherein the processing component is further configured to:
    receive a read command to read the first data stored in the first set of open memory blocks;
    initiate a read operation on the first set of open memory blocks;
    receive a second write command to store second data;
    compute second relative distances between a second plurality of open memory blocks, wherein the second plurality of open memory blocks are in the open memory block state, and wherein the first plurality of memory dies comprises the second plurality of open memory blocks;
    select a second set of open memory blocks for a second write operation, wherein the second write operation is for storing the second data, wherein the second set of open memory blocks is selected from the second plurality of open memory blocks, and wherein the second set of open memory blocks is selected based on the second relative distances so as to manage thermal dissipation; and
    initiate the second write operation on the second set of open memory blocks.

7. The system of claim 1, further comprising a second plurality of memory dies in a stacked configuration, the second plurality of memory dies comprising a second plurality of memory blocks to store data;
    wherein the processing component is coupled to the second plurality of memory dies and is further configured to:
        maintain the memory block states for the second plurality of memory blocks; and
        select the first plurality of memory dies for the first write operation.

8. The system of claim 7, further comprising:
    a first memory device comprising the first plurality of memory dies;
    a second memory device comprising the second plurality of memory dies;
    wherein the processing component is a controller coupled to the first and second memory devices; and
    a host interface configured to couple the processing component to a host.

9. The system of claim 7, wherein the processing component is further configured to:
    compute second relative distances between a second plurality of open memory blocks, wherein the second plurality of open memory blocks are in the open memory block state, and wherein the second plurality of memory dies comprises the second plurality of open memory blocks;
    select a second set of open memory blocks for a second write operation for storing the first data, wherein the second set of open memory blocks is selected from the second plurality of open memory blocks, and wherein the second set of open memory blocks is selected based on the second relative distances so as to manage thermal dissipation; and
    initiate a second write operation on the second set of open memory blocks, wherein the first write operation stores a first portion of the first data, and wherein the second write operation stores a second portion of the first data.

10. The system of claim 9, wherein the processing component is further configured to:
maintain memory die states for the first plurality of memory dies and the second plurality of memory dies, wherein the memory die states comprise:
an active memory die state allowing write operations; and
an inactive memory die state preventing write operations;
select a first one or more active memory dies for the computing of the first relative distances between the first plurality of open memory blocks;
wherein the selected first one or more active memory dies:
are in the active memory dies state;
are selected from the first plurality of memory dies; and
comprise the first plurality of open memory blocks;
wherein the first set of open memory blocks are collectively disposed across each of a first set of active memory dies; and
wherein the selected first one or more active memory dies comprise the first set of active memory dies; and
select a second one or more active memory dies for the computing of the second relative distances between the second plurality of open memory blocks;
wherein the selected second one or more active memory dies:
are in the active memory dies state;
are selected from the second plurality of memory dies; and
comprise the second plurality of open memory blocks;
wherein the second set of open memory blocks are collectively disposed across each of a second set of active memory dies; and
wherein the selected second one or more active memory dies comprise the second set of active memory dies.

11. A method for managing thermal dissipation in multi-stacked memory dies, the method comprising:
maintaining, by a processing component, memory block states for a first plurality of memory blocks, wherein the processing component is coupled to a first plurality of memory dies in a stacked configuration, wherein the first plurality of memory dies comprises the first plurality of memory blocks to store data, and wherein the memory block states comprise:
an open memory block state allowing write operations; and
a closed memory block state preventing write operations;
receiving, by the processing component, a first write command to store first data;
computing, by the processing component, first relative distances between a first plurality of open memory blocks, wherein the first plurality of open memory blocks are in the open memory block state, and wherein the first plurality of memory dies comprises the first plurality of open memory blocks;
selecting, by the processing component, a first set of open memory blocks for a first write operation, wherein the first write operation is for storing the first data, wherein the first set of open memory blocks is selected from the first plurality of open memory blocks, and wherein the first set of open memory blocks is selected based on the first relative distances so as to manage thermal dissipation; and
initiating, by the processing component, the first write operation on the first set of open memory blocks.

12. The method of claim 11, further comprising:
maintaining, by the processing component, memory die states for the first plurality of memory dies, wherein the memory die states comprise:
an active memory die state allowing write operations; and
an inactive memory die state preventing write operations;
selecting, by the processing component, one or more active memory dies for the computing of the first relative distances between the first plurality of open memory blocks;
wherein the selected one or more active memory dies:
are in the active memory die state;
are selected from the first plurality of memory dies; and
comprise the first plurality of open memory blocks;
wherein the first set of open memory blocks are collectively disposed across each of the first set of active memory dies; and
wherein the selected one or more active memory dies comprise the first set of active memory dies; and
updating, by the processing component, the maintained memory block states, in response to the first write operation, to indicate a change of the first set of open memory blocks from the open memory block state to the closed memory block state.

13. The method of claim 12, further comprising updating, by the processing component, the maintained memory die states to indicate a change to the inactive memory die state for any of the first set of active memory dies that reaches a predetermined minimum threshold number of open memory blocks remaining.

14. The method of claim 12, wherein the selecting of the first set of open memory blocks is further based on reducing adjacent memory dies so as to manage thermal dissipation.

15. The method of claim 11, further comprising:
receiving, by the processing component, a read command to read the first data stored in the first set of open memory blocks;
initiating, by the processing component, a read operation on the first set of open memory blocks.
receiving, by the processing component, a second write command to store second data;
computing, by the processing component, second relative distances between a second plurality of open memory blocks, wherein the second plurality of open memory blocks are in the open memory block state, and wherein the first plurality of memory dies comprises the second plurality of open memory blocks;
selecting, by the processing component, a second set of open memory blocks for a second write operation, wherein the second write operation is for storing the second data, wherein the second set of open memory blocks is selected from the second plurality of open memory blocks, and wherein the second set of open memory blocks is selected based on the second relative distances so as to manage thermal dissipation; and
initiating, by the processing component, the second write operation on the second set of open memory blocks.

16. The method of claim 11, further comprising:
maintaining, by the processing component, the memory block states for a second plurality of memory blocks, wherein the processing component is coupled to a second plurality of memory dies in a stacked configuration, and wherein the second plurality of memory dies comprises the second plurality of memory blocks to store data; and selecting the first plurality of memory dies for the first write operation.

17. The method of claim 16, further comprising:

computing, by the processing component, second relative distances between a second plurality of open memory blocks, wherein the second plurality of open memory blocks are in the open memory block state, and wherein the second plurality of memory dies comprises the second plurality of open memory blocks;

selecting, by the processing component, a second set of open memory blocks for a second write operation for storing the first data, wherein the second set of open memory blocks is selected from the second plurality of open memory blocks, and wherein the second set of open memory blocks is selected based on the second relative distances so as to manage thermal dissipation; and initiating, by the processing component, the second write operation on the second set of open memory blocks, wherein the first write operation stores a first portion of the first data, and wherein the second write operation stores a second portion of the first data.

18. The method of claim 17, further comprising:

maintaining, by the processing component, memory die states for the first plurality of memory dies and the second plurality of memory dies, wherein the memory die states comprise:
an active memory die state allowing write operations; and
an inactive memory die state preventing write operations;

selecting, by the processing component, a first one or more active memory dies for the computing of the first relative distances between the first plurality of open memory blocks;

wherein the selected first one or more active memory dies:
are in the active memory die state;
are selected from the first plurality of memory dies; and
comprise the first plurality of open memory blocks;

wherein the first set of open memory blocks are collectively disposed across each of a first set of active memory dies; and wherein the selected first one or more active memory dies comprise the first set of active memory dies; and selecting, by the processing component, a second one or more active memory dies for the computing of the second relative distances between the second plurality of open memory blocks;

wherein the selected second one or more active memory dies:
are in the active memory die state;
are selected from the second plurality of memory dies; and
comprise the second plurality of open memory blocks;

wherein the second set of open memory blocks are collectively disposed across each of a second set of active memory dies; and wherein the selected second one or more active memory dies comprise the second set of active memory dies.

19. One or more non-transitory computer-readable storage media comprising instructions, which when executed by a processing component, cause the processing component to:

maintain memory block states for a first plurality of memory blocks, wherein the processing component is coupled to a first plurality of memory dies in a stacked configuration, wherein the first plurality of memory dies comprises the first plurality of memory blocks to store data, and wherein the memory block states comprise:
an open memory block state allowing write operations; and
a closed memory block state preventing write operations;

receive a first write command to store first data;

compute first relative distances between a first plurality of open memory blocks, wherein the first plurality of open memory blocks are in the open memory block state, and wherein the first plurality of memory dies comprises the first plurality of open memory blocks;

select a first set of open memory blocks for a first write operation, wherein the first write operation is for storing the first data, wherein the first set of open memory blocks is selected from the first plurality of open memory blocks, and wherein the first set of open memory blocks is selected based on the first relative distances so as to manage thermal dissipation; and initiate the first write operation on the first set of open memory blocks.

20. The one or more non-transitory computer-readable storage media of claim 19, wherein the instructions, when executed by the processing component, further cause the processing component to:

maintain memory die states for the first plurality of memory dies, wherein the memory die states comprise:
an active memory die state allowing write operations; and
an inactive memory die state preventing write operations;

select one or more active memory dies for the computing of the first relative distances between the first plurality of open memory blocks;

wherein the selected one or more active memory dies:
are in the active memory die state;
are selected from the first plurality of memory dies; and
comprise the first plurality of open memory blocks;

wherein the first set of open memory blocks are collectively disposed across each of a first set of active memory dies; and wherein the selected one or more active memory dies comprise the first set of active memory dies; and update the maintained memory block states, in response to the first write operation, to indicate a change of the first set of open memory blocks from the open memory block state to the closed memory block state.

* * * * *